US009743522B2

(12) United States Patent
Li et al.

(10) Patent No.: US 9,743,522 B2
(45) Date of Patent: Aug. 22, 2017

(54) PRINTED CIRCUIT BOARD WITH COMPACT GROUPS OF DEVICES

(71) Applicant: Apple Inc., Cupertino, CA (US)

(72) Inventors: Xingqun Li, San Jose, CA (US); Carlos Ribas, Los Altos, CA (US); Dennis R. Pyper, San Jose, CA (US); James H. Foster, Palo Alto, CA (US); Joseph R. Fisher, Jr., San Jose, CA (US); Scott P. Mullins, Morgan Hill, CA (US); Sean A. Mayo, Mountain View, CA (US); Wyeman Chen, Fremont, CA (US)

(73) Assignee: Apple Inc., Cupertino, CA (US)

( * ) Notice: Subject to any disclaimer, the term of this patent is extended or adjusted under 35 U.S.C. 154(b) by 1054 days.

(21) Appl. No.: 13/627,989

(22) Filed: Sep. 26, 2012

(65) Prior Publication Data
US 2014/0085850 A1    Mar. 27, 2014

(51) Int. Cl.
*H01G 4/30* (2006.01)
*H05K 1/18* (2006.01)
(Continued)

(52) U.S. Cl.
CPC ........... *H05K 1/181* (2013.01); *H05K 1/0231* (2013.01); *H05K 1/0233* (2013.01); *H05K 1/11* (2013.01); *H05K 1/115* (2013.01); *H05K 3/303* (2013.01); *H01L 2224/16235* (2013.01); *H01L 2924/15159* (2013.01); *H01L 2924/15192* (2013.01); *H01L 2924/15311* (2013.01); *H01L 2924/19103* (2013.01); *H05K 1/183* (2013.01); *H05K 1/185* (2013.01); *H05K 3/284* (2013.01); *H05K 3/4614* (2013.01); *H05K 2201/1003* (2013.01); *H05K 2201/1006* (2013.01);
(Continued)

(58) Field of Classification Search
CPC ......... H05K 1/0233; H05K 1/181; H01G 4/38
USPC ...................... 361/301.4, 328, 329
See application file for complete search history.

(56) References Cited

U.S. PATENT DOCUMENTS 4,821,005 A * 4/1989 Kling .................. H05K 1/0231
                                                      333/12
5,068,631 A * 11/1991 Vince .................. H05K 1/0225
                                                      174/250
(Continued)

*Primary Examiner* — Steven T Sawyer
(74) *Attorney, Agent, or Firm* — Treyz Law Group, P.C.; Joseph F. Guihan

(57) ABSTRACT

Electronic devices may contain electrical systems in which electrical components are mounted on a substrate such as a printed circuit board. The electrical components may include surface mount technology components. Multiple surface mount technology components may be stacked on top of each other and beside each other to form an electrical component that minimizes the amount of area that is consumed on a printed circuit board. Noise suppression circuits and other circuits may be implemented using stacked surface mount technology components. Surface mount technology components placed on the printed circuit board may be pushed together and subsequently injection molded to form packed component groups. An integrated circuit may be mounted to the printed circuit board via an interposer and may cover components mounted to the printed circuit board. An integrated circuit may be mounted over a recessed portion of the printed circuit board on which components are mounted.

14 Claims, 27 Drawing Sheets

(51) Int. Cl.
*H05K 1/11* (2006.01)
*H05K 3/30* (2006.01)
*H05K 1/02* (2006.01)
*H05K 3/28* (2006.01)
*H05K 3/46* (2006.01)

(52) U.S. Cl.
CPC .............. *H05K 2201/10015* (2013.01); *H05K 2201/10022* (2013.01); *H05K 2201/1053* (2013.01); *H05K 2201/10378* (2013.01); *H05K 2201/10454* (2013.01); *H05K 2201/10515* (2013.01); *H05K 2201/10522* (2013.01); *H05K 2201/10537* (2013.01); *H05K 2201/10636* (2013.01); *H05K 2201/10734* (2013.01); *H05K 2203/1316* (2013.01); *H05K 2203/1327* (2013.01); *Y02P 70/611* (2015.11); *Y10T 29/49146* (2015.01)

(56) References Cited

U.S. PATENT DOCUMENTS

| | | | |
|---|---|---|---|
| 7,309,913 | B2 | 12/2007 | Shim et al. |
| 7,942,700 | B2 | 5/2011 | Gutierrez et al. |
| 2005/0185360 | A1* | 8/2005 | Purple et al. ................. 361/320 |
| 2006/0113653 | A1* | 6/2006 | Xiaoqi ................ H01L 23/5385 257/686 |
| 2007/0187844 | A1* | 8/2007 | Chen ............................ 257/789 |
| 2008/0210743 | A1* | 9/2008 | Lee et al. ...................... 228/260 |
| 2009/0078456 | A1 | 3/2009 | Macropoulos et al. |
| 2010/0301473 | A1 | 12/2010 | Sasaoka |
| 2011/0134613 | A1 | 6/2011 | Moussaoui et al. |
| 2011/0248397 | A1 | 10/2011 | Coffy et al. |
| 2012/0262145 | A1* | 10/2012 | Chen ..................... H01L 23/645 323/311 |
| 2013/0329388 | A1* | 12/2013 | Dogauchi ............ H05K 1/0216 361/767 |

* cited by examiner

PRINTED CIRCUIT BOARD WITH COMPACT GROUPS OF DEVICES

BACKGROUND

This relates generally to electronic components, and more particularly, to mounting electronic components on substrates.

Electronic equipment such as computers, portable devices, and other electronic devices often include integrated circuits. Integrated circuits and other components may be mounted to substrates such as printed circuit boards. Surface mount technology (SMT) is often used. For example, printed circuit boards may be provided with surface mount technology components such as capacitors, resistors, and inductors.

It is often desirable to minimize the size of electronic equipment. This can be challenging, particularly when a printed circuit contains numerous components.

It would therefore be desirable to be able to minimize the amount of area consumed on a printed circuit board when mounting components such as surface mount technology components.

SUMMARY

Electronic devices may contain electrical systems based on integrated circuits and other circuitry. The integrated circuits and other circuitry may be mounted on a printed circuit board or other substrate.

Contacts in the printed circuit board may be coupled to interconnect traces within the board. Integrated circuits and other electrical components may be mounted to the printed circuit board contacts.

The electrical components on the printed circuit board may include surface mount technology components. Multiple surface mount technology components may be stacked on top of each other and beside each other to minimize the amount of area that is consumed on the printed circuit board. Solder or other conductive materials may be used in interconnecting the terminals of surface mount technology components. Noise suppression circuits and other circuits may be implemented using stacked surface mount technology components.

Component placement tools (sometimes referred to as pick and place tools) may be used to place individual surface mount technology components on the printed circuit board. The surface mount technology components may be pushed together and subsequently injection molded to form packed component groups on the printed circuit board.

An interposer may be mounted to the printed circuit board and provide a raised platform on which an integrated circuit is mounted. The integrated circuit may cover an area of the printed circuit board that is greater than the area occupied by the interposer. Components may be mounted adjacent to the interposer so that the integrated circuit partially or entirely covers the components.

The printed circuit board may be formed with a recessed portion on which components are mounted. An integrated circuit may be mounted over the recessed portion to cover the components.

Further features of the invention, its nature and various advantages will be more apparent from the accompanying drawings and the following detailed description of the preferred embodiments.

DETAILED DESCRIPTION

Electronic devices such as cellular telephones, tablet computers, laptop computers, desktop computers, computers integrated into computer monitors, televisions, media players, portable devices, and other electronic equipment may include integrated circuits and other electronic components.

The electronic components may be mounted on a substrate such as a printed circuit or other dielectric substrate. A printed circuit substrate may be formed from a rigid printed circuit board such as a fiberglass-filled epoxy board or may be formed from a flexible printed circuit structure ("flex circuit") formed from a flexible sheet of polymer such as polyimide. Other substrates may be formed from glass, ceramic, plastic, or other dielectrics. The electronic components that are mounted on a substrate may include discrete components such as capacitors, resistors, and inductors and may include integrated circuits such as microprocessors, system-on-chip integrated circuits, memory chips, audio and video circuits, communications chips, application-specific integrated circuits, and other devices.

Figure 1:
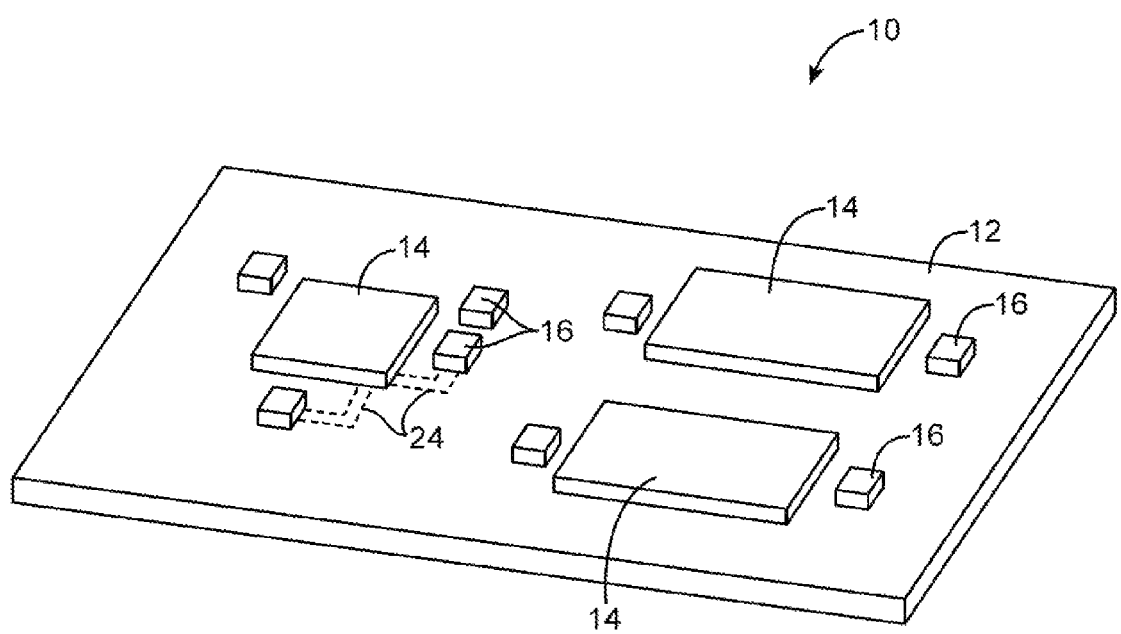
FIG. 1 is a perspective view of a printed circuit board populated with surface mount technology components and integrated circuits in accordance with an embodiment of the present invention.

FIG. 1 is a perspective view of an illustrative electrical system formed from circuitry mounted on a substrate. Circuitry 10 of FIG. 1 may be used in a cellular telephone, computer, television, media player, or other electronic equipment. Circuitry 10 may include components such as integrated circuits 14 mounted on substrate 12. Substrate 12 may be formed from a dielectric structure such as a plastic structure, ceramic structure, glass structure, or other structure. If desired, substrate 12 may be formed from a printed circuit structure. As an example, substrate 12 may be a rigid printed circuit board or a flexible printed circuit.

Components such as electronic components 16 may also be mounted on substrate 12. Electronic components 16 may include discrete components such as resistors, capacitors, and inductors (as an example). If desired, components 16 may be mounted adjacent to integrated circuits 14. Conductive interconnects such as traces 24 of FIG. 1 may be used to interconnect the circuits formed form components 16 with circuits 14.

Components 16 may be used to form noise suppressing circuits for integrated circuits 14. For example, components 16 may be used to form power supply noise suppressing circuits (e.g., low-pass filters) that remove undesired noise from power supply signals being provided to integrated circuits 14 via traces 24. Components 16 may also be used in forming other types of circuitry, if desired. The use of components 16 to form noise-suppressing filter circuits is merely illustrative.

Components 16 may be formed using surface mount technology (SMT) parts. For example, surface mount devices (SMDs) such as SMT capacitors, SMT inductors, and SMT resistors may be used in forming components 16. To conserve space on substrate 12, multiple individual SMT components may be used in forming each component 16. For example, multiple SMT capacitors, SMT resistors, and/or SMT inductors may be vertically stacked and/or horizontally stacked to form a component such as component 16. Components 16 that have been formed from multiple SMT devices are sometimes referred to herein as stacked components.

Figure 2:
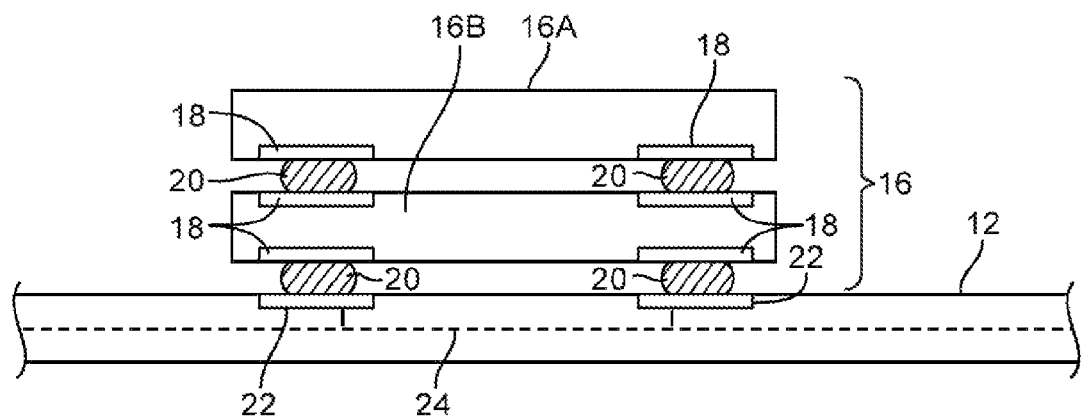
FIG. 2 is a cross-sectional side view of an illustrative printed circuit board with stacked surface mount technology components in accordance with an embodiment of the present invention.

An illustrative stacked component is shown in FIG. 2. As shown in FIG. 2, stacked component 16 may include multiple SMT devices such as first SMT component 16A and second SMT component 16B. Stacked component 16 of FIG. 2 has two SMT components. If desired, stacked component 16 may have two or more SMT components, three or more SMT components, four or more SMT components, etc. The SMT components in stacked component 16 may be stacked on top of each other, may be stacked side by side, or may be attached to each other using a combination of horizontal and vertical stacking. These stacking arrangements may conserve surface area on substrate 12 and therefore allow electronic equipment that includes substrate 12 to be formed compactly.

Each SMT component in stacked component 16 may have contacts 18. Contacts 18, which may sometimes be referred to as terminals or contact pads, may be formed from metal such gold plated copper (as an example). Conductive material 20 may be used in attaching contacts 18 on one component to contacts 18 on another component and/or to contacts such as pads 22 on substrate 12. Contacts on substrate 12 such as contact pads 22 (e.g., printed circuit board contacts) may be formed from portions of metal traces 24. Traces 24 may form signal interconnect lines on substrate 12. One or more layers of interconnects in substrate 12 may be used in routing signals between components 16 and integrated circuits 14 (FIG. 1).

Conductive material 20 may be formed from solder, conductive adhesive, or other conductive substances. If desired, contacts 18 may be coupled to each other using welds, using shared conductive structures that form multiple contacts 18 (e.g., a metal member that is common to multiple contacts 18), or other electrically conductive structures. The use of solder to connect contacts 18 to each other is sometimes described herein as an example.

Solder connections such as connections 20 of FIG. 2 may be formed from solder paste. Solder paste may be deposited on contacts 18 by screen printing, painting, ink-jet printing, or other suitable techniques. To form solder connections such as solder connections 20 of FIG. 2, the solder paste may be heated. Heat may be applied to the solder paste in a reflow oven or using a heated element (as examples).

Figure 3:
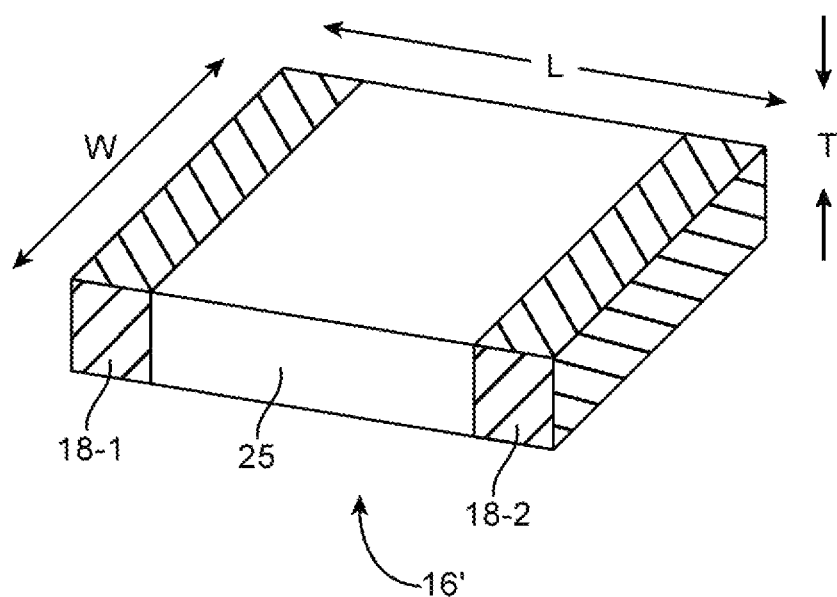
FIG. 3 is a perspective view of an illustrative surface mount device in accordance with an embodiment of the present invention.

FIG. 3 is a perspective view of an illustrative SMT component. As shown in FIG. 3, SMT component (surface mount device) 16' may have a package housing such as housing 26. A portion of housing 25 such as the center of housing 26 may be free of conductive contact material. Terminals may be formed from contacts 18-1 and 18-2 on housing 25. Contacts 18-1 and 18-2 may be formed from metal or other conductive material. In the example of FIG. 3, contacts 18-1 and 18-2 have been formed on opposing ends of housing 25. Other configurations for the contacts in SMT device 16' may be used if desired.

An electrical component such as a resistor, capacitor, or inductor (or a circuit formed from multiple circuit components) may be housed within housing 25. Housing 25 may be characterized by a length L, and width W, and a thickness T. For example, in a "0201" SMT component, the value of L may be 0.6 mm and the value of W may be 0.3 mm. In a "1005" SMT component, the value of L may be 0.4 mm and the value of W may be 0.2 mm. Other types of packages may be used if desired. The use of 0201 and 1005 packages is merely illustrative. Thickness T may be less than W (as an example).

Figure 4:
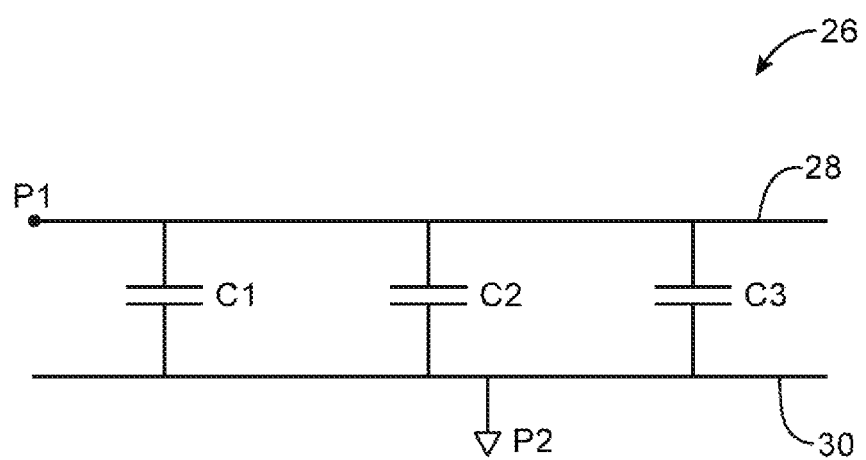
FIG. 4 is a circuit diagram of an illustrative circuit of the type that may be implemented using stacked components in accordance with an embodiment of the present invention.

An illustrative noise-reducing circuit that may be formed using stacked SMT components is shown in FIG. 4. As shown in FIG. 4, noise-reducing circuit 26 may include three capacitors C1, C2, and C3 connected in parallel between line 28 and line 30. Line 28 may be connected to contact (pin) P1 and line 30 may be connected to contact P2. When mounted on printed circuit substrate 12, contacts P1 and P2 may be soldered or otherwise connected to corresponding printed circuit contact pads.

In an illustrative arrangement, line 30 may carry a ground power supply voltage and line 28 may carry a positive power supply voltage (as an example). A circuit such as circuit 26 may be formed on each power supply input for an integrated circuit. If, as an example, one of integrated circuits 14 of FIG. 1 has 10 power supply inputs, ten respective circuits such as circuit 26 may be included on printed circuit board 12, each of which may be coupled to a respective one of the power supply inputs using traces 24.

Figure 5:
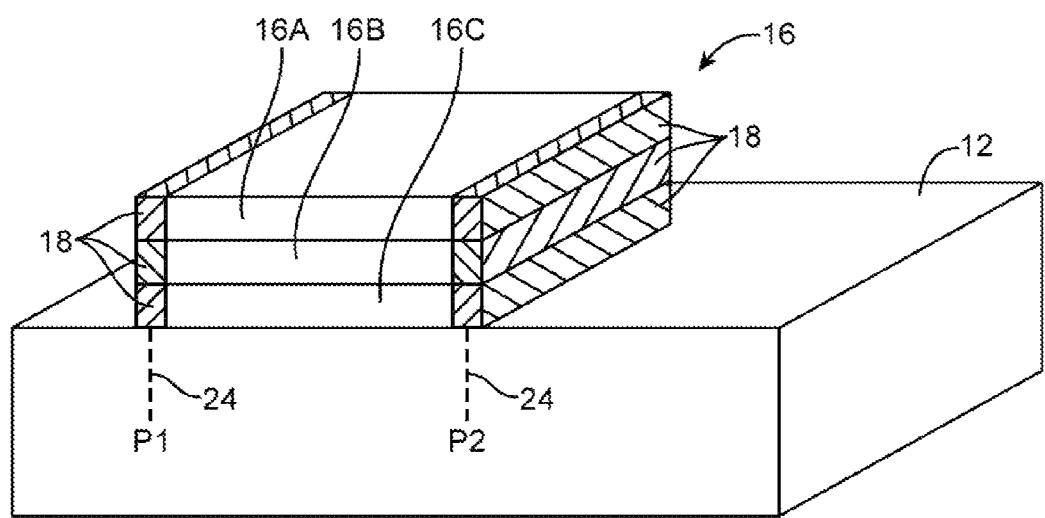
FIG. 5 is a perspective view of illustrative stacked components being used to implement a circuit of the type shown in FIG. 4 in accordance with an embodiment of the present invention.

FIG. 5 is a perspective view of an illustrative component 16 of the type that may be used in implementing circuit 26 of FIG. 4. As shown in FIG. 5, component 26 may be formed from three stacked SMT components 16A, 16B, and 16C. Component 16A may be a capacitor such as capacitor C1 of FIG. 4. Component 16B may be a capacitor such as capacitor C2 of FIG. 4. Capacitor C3 of FIG. 4 may be implemented using component 16C. Each of components 16A, 16B, and 16C may have a respective pair of terminals 18. Contacts 18 of component 16C may form contacts P1 and P2 for stacked component 16. Contacts P1 and P2 of component 16 may correspond to terminals P1 and P2 of circuit 26 of FIG. 4. Printed circuit board 12 may contain traces 24 that form printed circuit contacts that are coupled to contacts P1 and P2.

Terminals 18 at one end of component 16 may be shorted together and to contact P1 on printed circuit board 12 using conductive material 20 (FIG. 2). Terminals 18 at the opposing end of component 16 may be shorted to each other and to contact P2 using conductive material 20. If desired, one of the SMT components may be omitted (e.g., to form a circuit with two capacitors in parallel, rather than three) or additional SMT components may be added in parallel (e.g., to form a version of component 16 with four or more parallel capacitors). Moreover, stacked component arrangements of the type shown in FIG. 5 may be used with other types of SMT components (e.g., resistors, inductors, etc.) in addition to or instead of using capacitors. The example of FIGS. 4 and 5 is merely illustrative.

Figure 6:
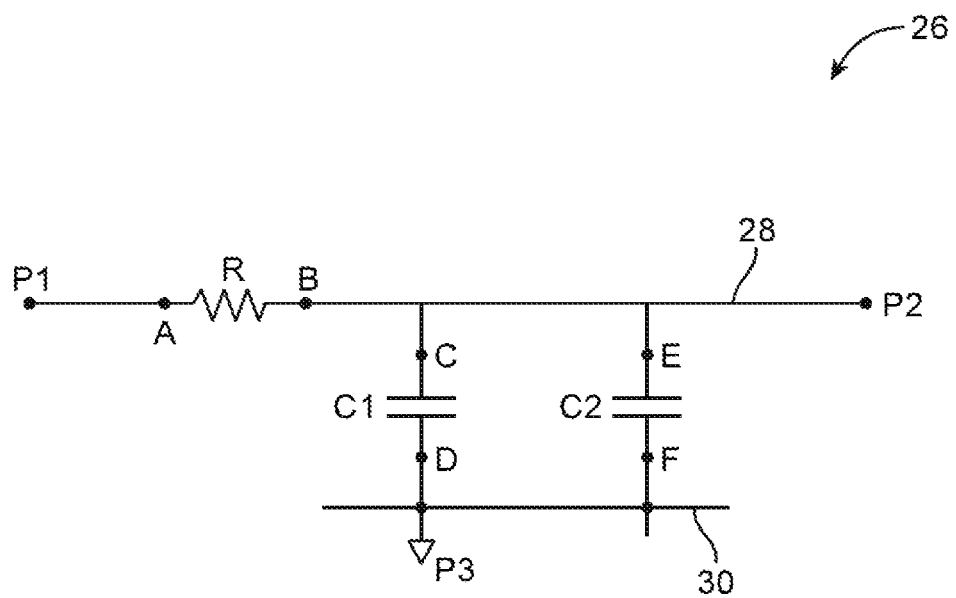
FIG. 6 is a circuit diagram of an illustrative circuit of the type that may be implemented using stacked components in accordance with an embodiment of the present invention.

Another illustrative noise-reducing circuit that may be formed using stacked SMT components is shown in FIG. 6. As shown in FIG. 6, circuit 26 may include capacitors C1 and C2 connected in parallel between line 28 and line 30. Resistor R may be coupled within line 28 between contact P1 and contact P2. Line 30 may be coupled to contact P3.

Line 28 may be coupled between contacts P1 and P2. Line 30 may be coupled to contact P3. Line 30 may, as an example, carry a ground power supply voltage and line 28 may, as an example, carry a positive power supply voltage. A circuit such as circuit 26 of FIG. 6 may, if desired, be coupled to each power supply path associated with an integrated circuit on substrate 12 to reduce power supply noise. Resistor R may have contacts A and B, capacitor C1 may have contacts C and D, and capacitor C2 may have contacts E and F.

Figure 7:
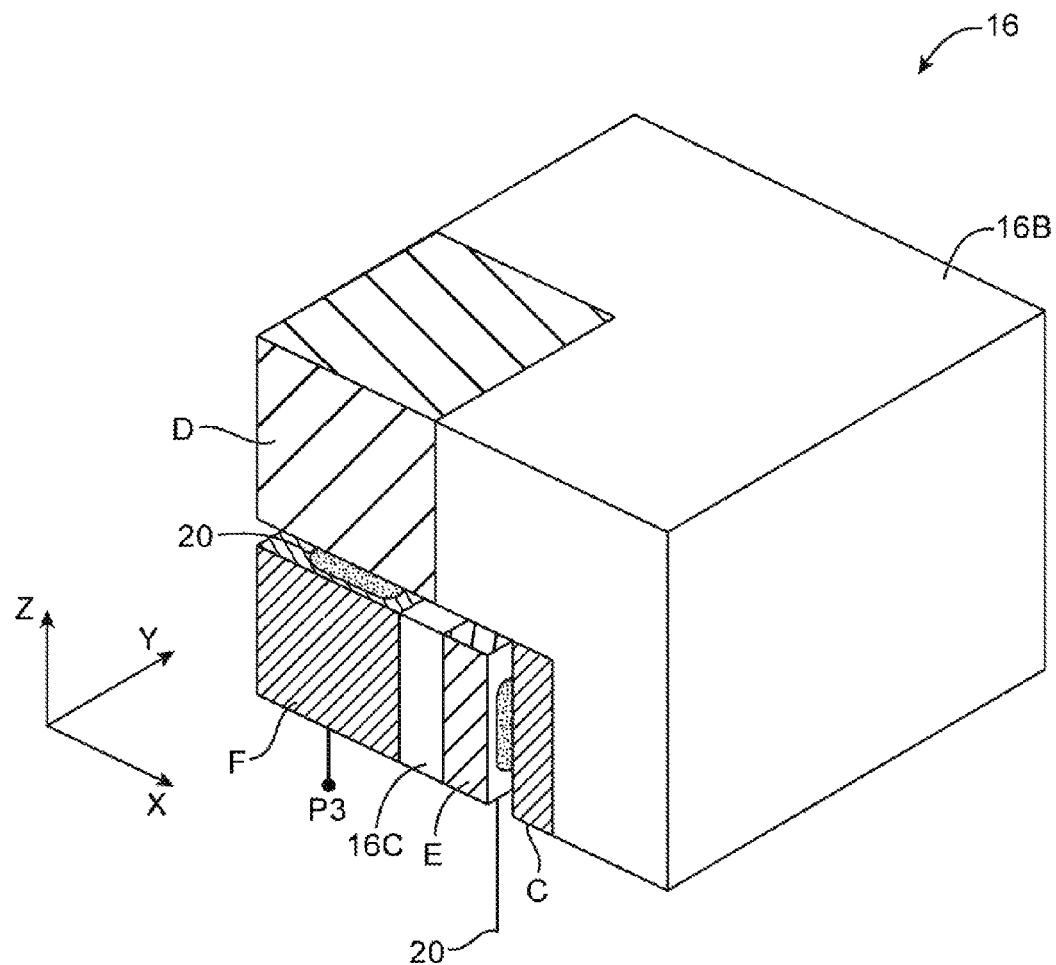
FIGS. 7 and 8 are perspective views of illustrative stacked components being used to implement a circuit of the type shown in FIG. 6 in accordance with an embodiment of the present invention.
Figure 8:
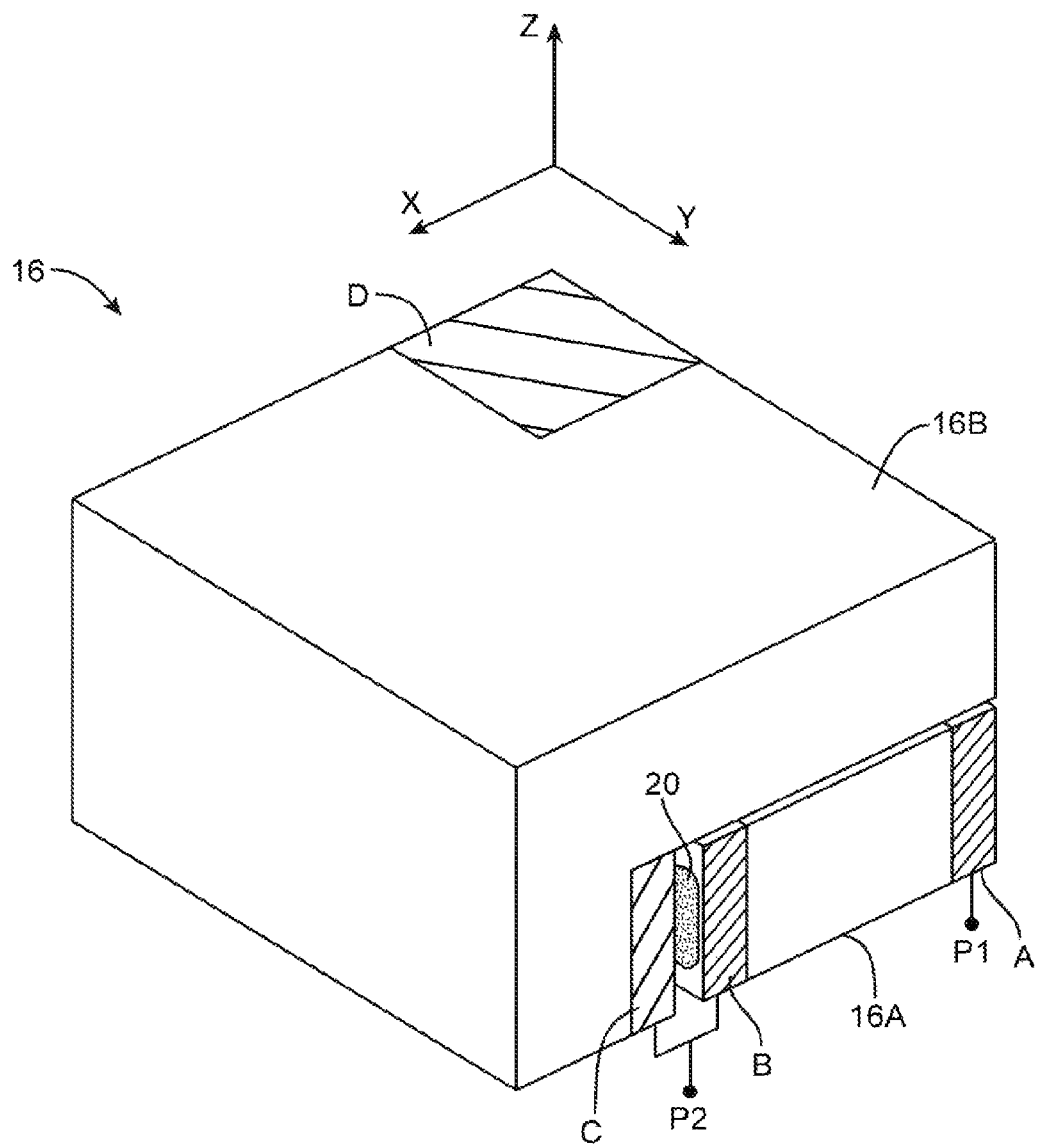
Figure 9:
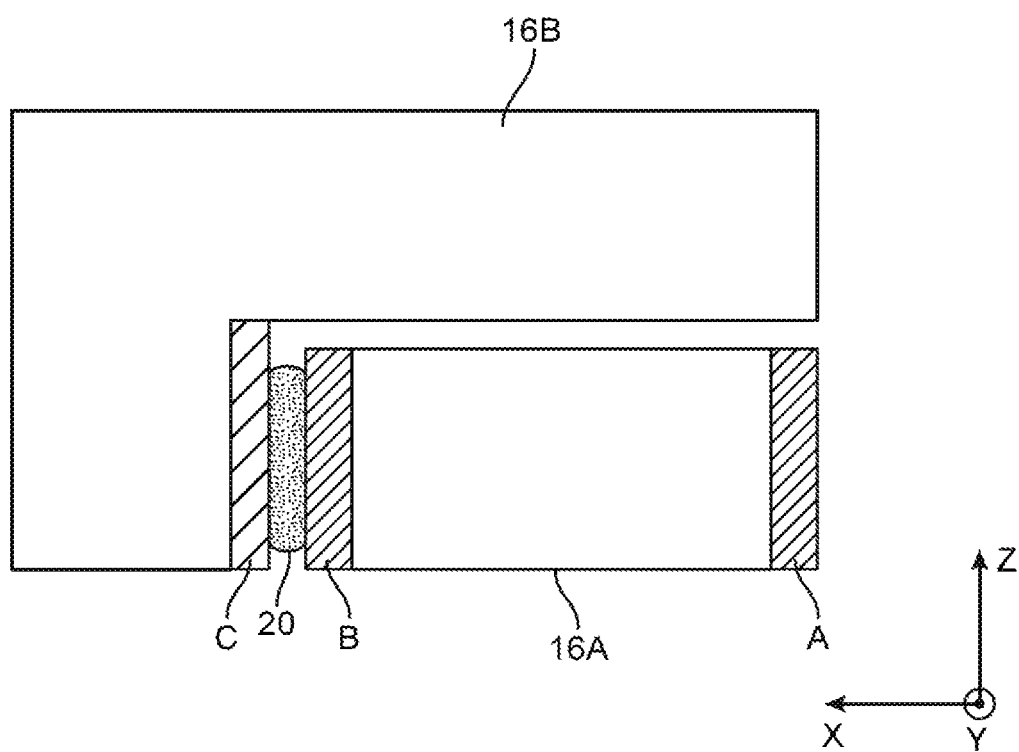
FIGS. 9 and 10 are side views of the stacked components of FIGS. 7 and 8 in accordance with an embodiment of the present invention.
Figure 10:
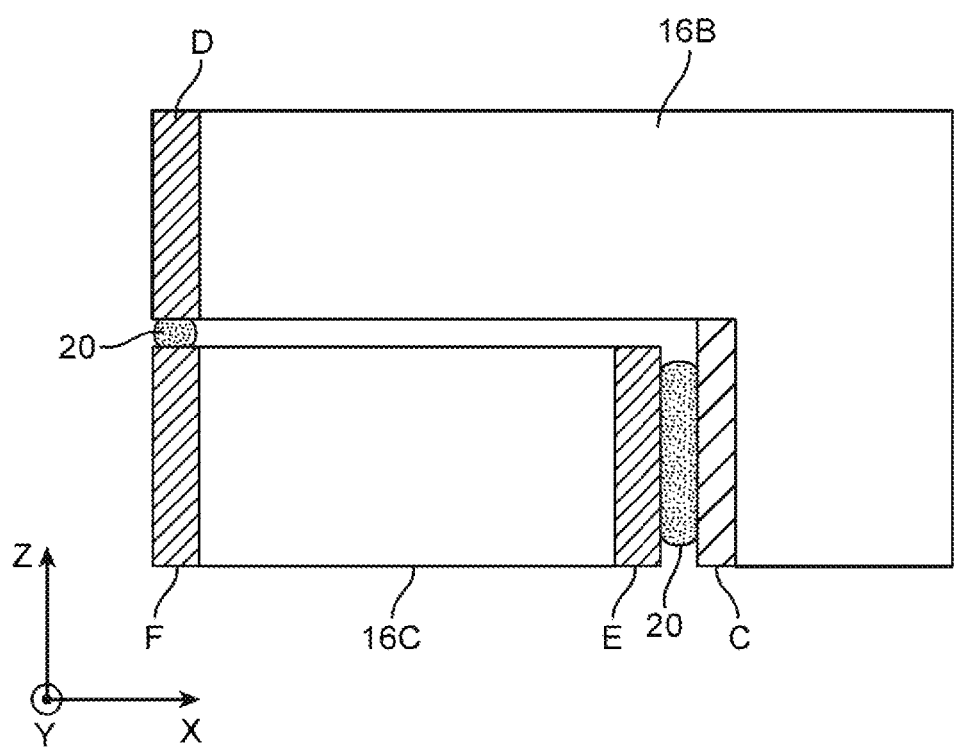

FIGS. 7 and 8 are perspective views of an illustrative component 16 of the type that may be used in implementing circuit 26 of FIG. 6. As shown in FIGS. 7 and 8, component 16 may be formed from three stacked SMT components 16A, 16B, and 16C. Component 16A may be a resistor such as resistor R of FIG. 6 and may have associated contacts A and B (i.e., contacts A and B of FIG. 6). Component 16B may be a capacitor such as capacitor C1 of FIG. 6 and may have contacts C and D (i.e., contacts C and D of FIG. 6). Capacitor C2 of FIG. 6 may be implemented using component 16C and may have contacts E and F (i.e., contacts E and F of FIG. 6). Contact F may form contact P3 for component 16, contacts C and B may form contact P2 for component 16, and contact A may form contact P1 for component 16. FIGS. 9 and 10 are side views of component 16 of FIGS. 7 and 8.

Figure 11:
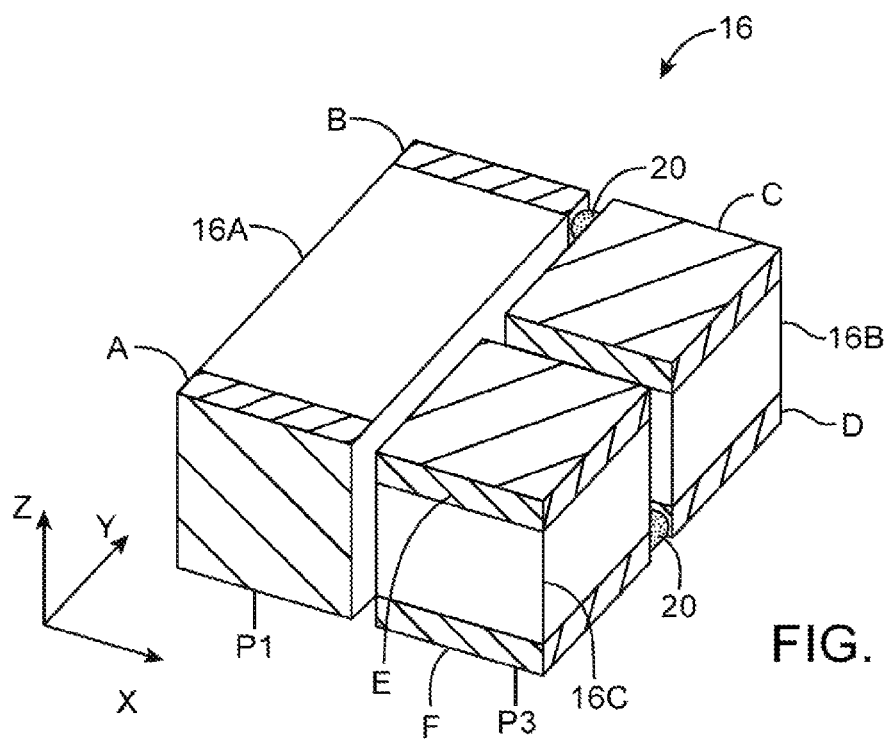
FIGS. 11 and 12 are perspective views of additional illustrative stacked components of the type that may be used to implement a circuit of the type shown in FIG. 4 in accordance with an embodiment of the present invention.
Figure 12:
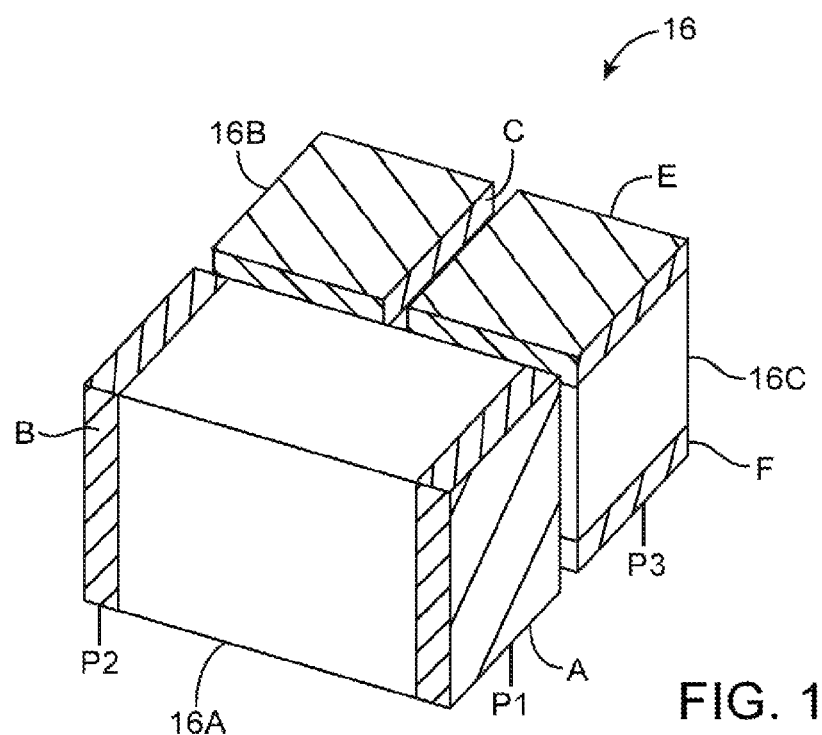

FIGS. 11 and 12 are perspective views of another illustrative component 16 of the type that may be used in implementing circuit 26 of FIG. 6. As shown in FIGS. 11 and 12, component 16 may be formed from three stacked SMT components 16A, 16B, and 16C. Component 16A may be a resistor such as resistor R of FIG. 6 and may have associated contacts A and B (i.e., contacts A and B of FIG. 6). Component 16B may be a capacitor such as capacitor C1 of FIG. 6 and may have contacts C and D (i.e., contacts C and D of FIG. 6). Capacitor C2 of FIG. 6 may be implemented using component 16C and may have contacts E and F (i.e., contacts E and F of FIG. 6). Contact A may form contact P1 for component 16, contact B may form contact P2 for component 16, and contact F may form contact P3 for component 16.

Figure 13:
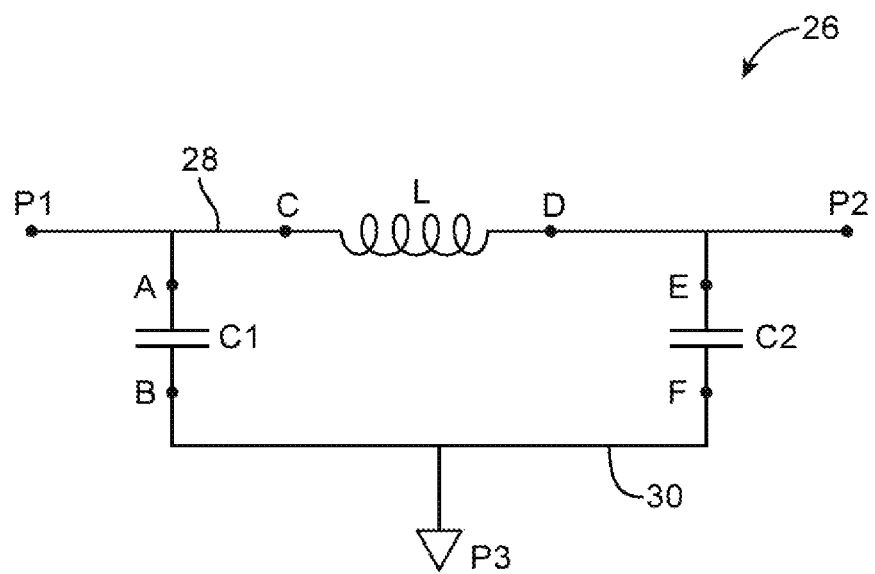
FIG. 13 is a circuit diagram of an illustrative circuit of the type that may be implemented using stacked components in accordance with an embodiment of the present invention.

Another illustrative noise-reducing circuit that may be formed using stacked SMT components is shown in FIG. 13. As shown in FIG. 13, circuit 26 may include two capacitors C1 and C2. Capacitor C1 may be connected between contact P1 on line 28 and contact P3 on line 30 and may have contacts A and B. Capacitor C2 may be connected between contact P2 on line 28 and contact P3 on line 30 and may have contacts E and F. Inductor L may be coupled in series between contacts P1 and P2 and may have contacts C and D. Circuit 26 of FIG. 13 may be used to reduce power supply noise on board 12.

Figure 14:
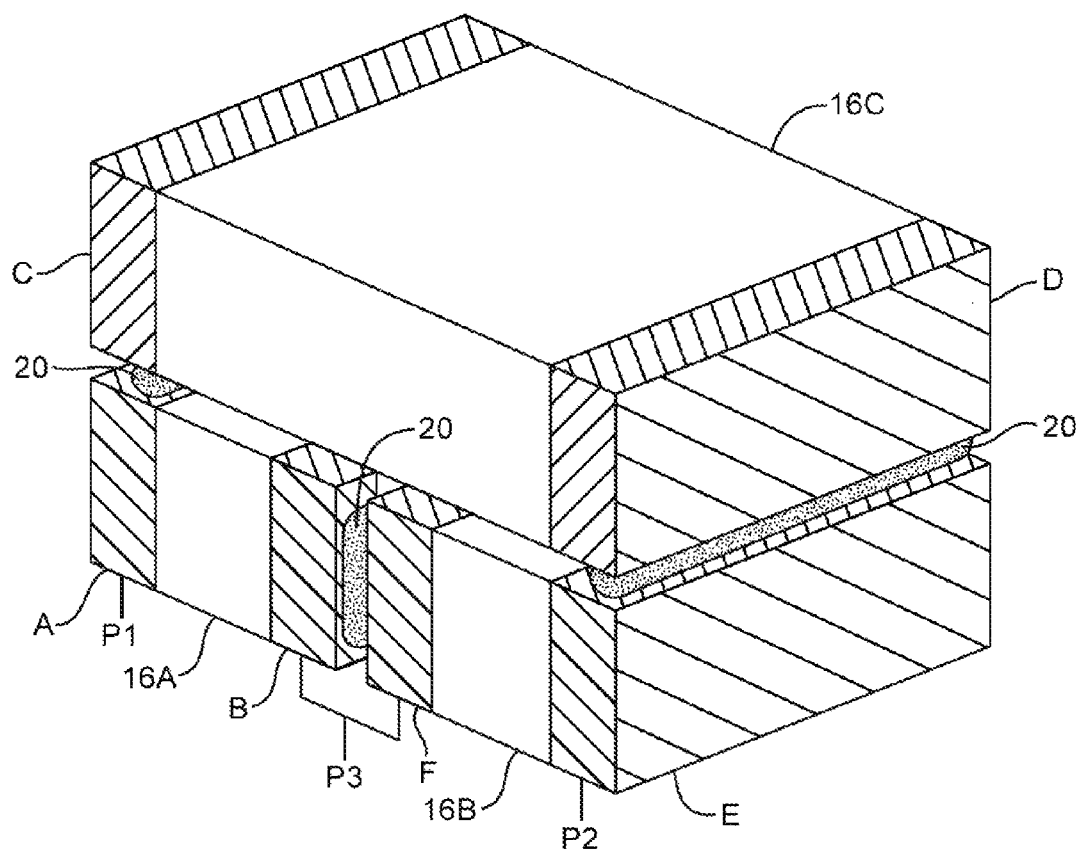
FIG. 14 is a perspective view of illustrative stacked components being used to implement a circuit of the type shown in FIG. 13 in accordance with an embodiment of the present invention.

FIG. 14 is a perspective view of an illustrative component 16 of the type that may be used in implementing circuit 26 of FIG. 13. As shown in FIG. 14, component 16 may be formed from three stacked SMT components 16A, 16B, and 16C. Component 16A may be a capacitor such as capacitor C1 of FIG. 13. Component 16B may be a capacitor such as capacitor C2 of FIG. 13. Component 16C may be an inductor such as inductor L of FIG. 13.

As shown in FIG. 14, contact A may form contact P1 for component 16, contact E may form contact P2 for component 16, and contacts B and F may form contact P3 for component 16.

Figure 15:
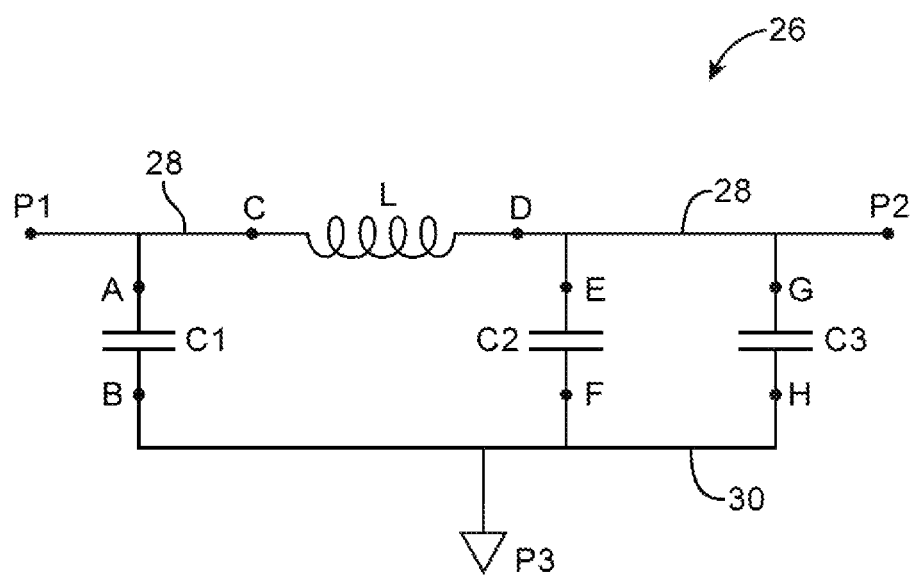
FIG. 15 is a circuit diagram of an illustrative circuit of the type that may be implemented using stacked components in accordance with an embodiment of the present invention.

FIG. 15 is a circuit diagram of another illustrative noise-reducing circuit that may be formed using stacked SMT components. As shown in FIG. 15, circuit 26 may include three capacitors C1, C2, and C3. Capacitor C1 may be connected between contact P1 and contact P3 on line 30 and may have contacts A and B. Capacitor C2 may be connected between contact P2 on line 28 and contact P3 on line 30 and may have contacts E and F. Capacitor C3 may be connected between contact P2 on line 28 and contact P3 on line 30 and may have contacts G and H. Inductor L may be coupled in series between contacts P1 and P2 within line 28 and may have contacts C and D. Circuit 26 of FIG. 15 may be used to reduce power supply noise on power supply lines 28 and 30 and may be coupled to the power supply inputs of integrated circuits such as integrated circuits 14 of FIG. 1 (as an example).

Figure 16:
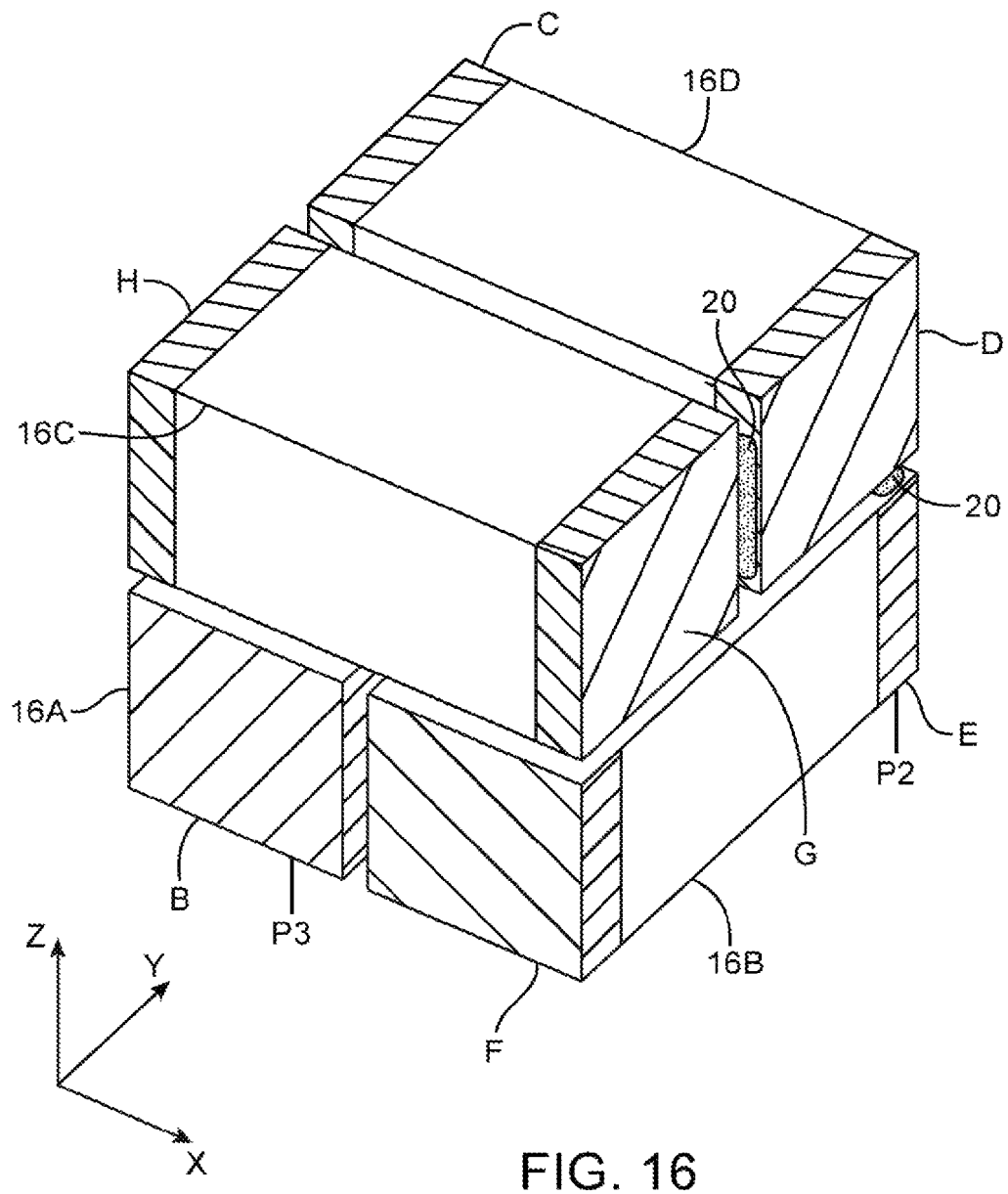
FIG. 16 is a perspective view of illustrative stacked components being used to implement a circuit of the type shown in FIG. 15 in accordance with an embodiment of the present invention.

FIG. 16 is a perspective view of an illustrative component 16 of the type that may be used in implementing circuit 26 of FIG. 15. As shown in FIG. 16, component 16 may be formed from four stacked SMT components 16A, 16B, 16C, and 16D. Component 16A may be a capacitor such as capacitor C1 of FIG. 15. Component 16B may be a capacitor such as capacitor C2 of FIG. 15. Component 16C may be a capacitor such as capacitor C3 of FIG. 15. Component 16D may be an inductor such as inductor L of FIG. 15.

Figure 17:
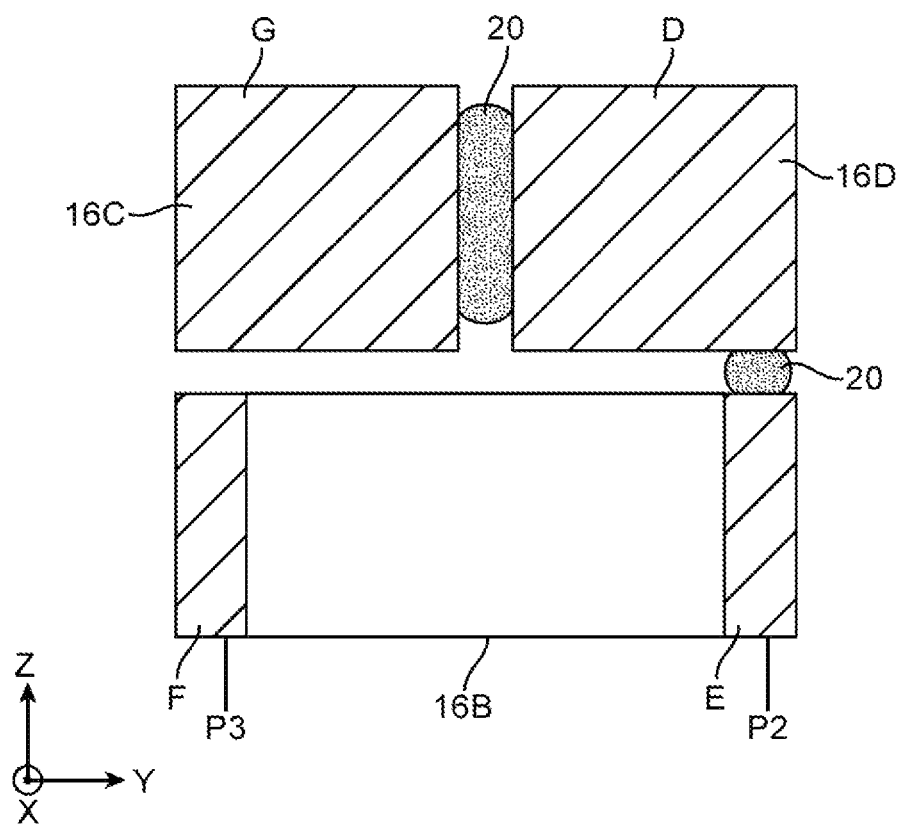
FIGS. 17 and 18 are side views of the stacked components of FIG. 16 in accordance with an embodiment of the present invention.
Figure 18:
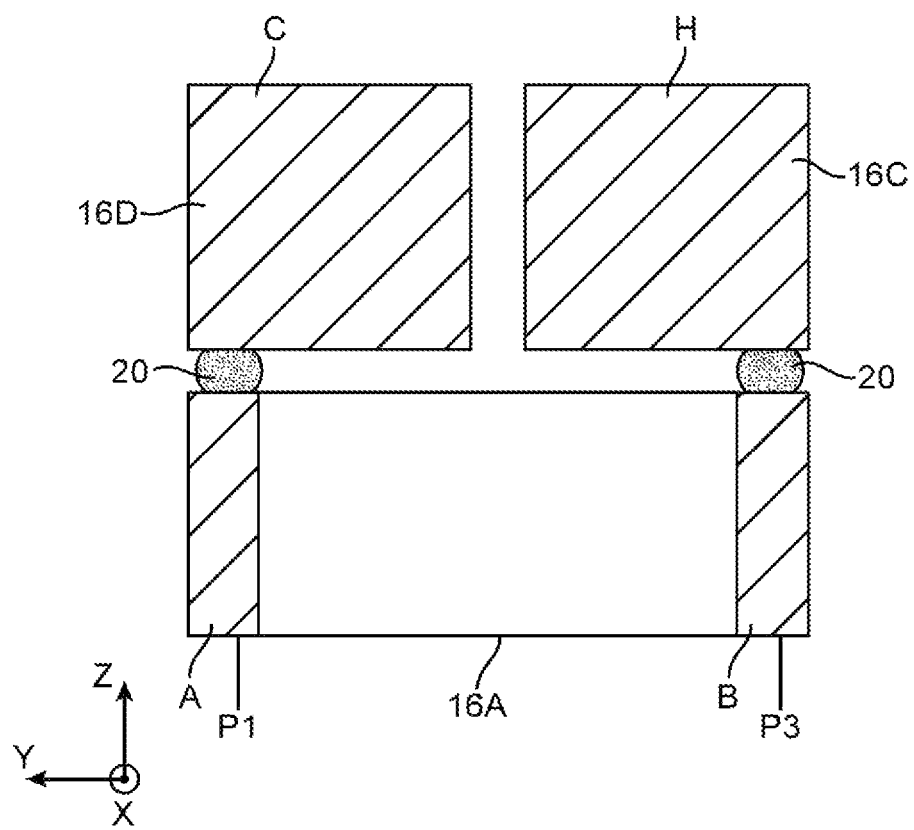

FIGS. 17 and 18 are side views of component 16 of FIG. 16.

As shown in FIGS. 16, 17, and 18, contact P1 of component 16 may be formed from contact A on component 16A, contact P2 of component 16 may be formed from contact E on component 16B, and contact P3 of component 16 may be formed from contact B of component 16A and contact F of component 16B.

Figure 19:
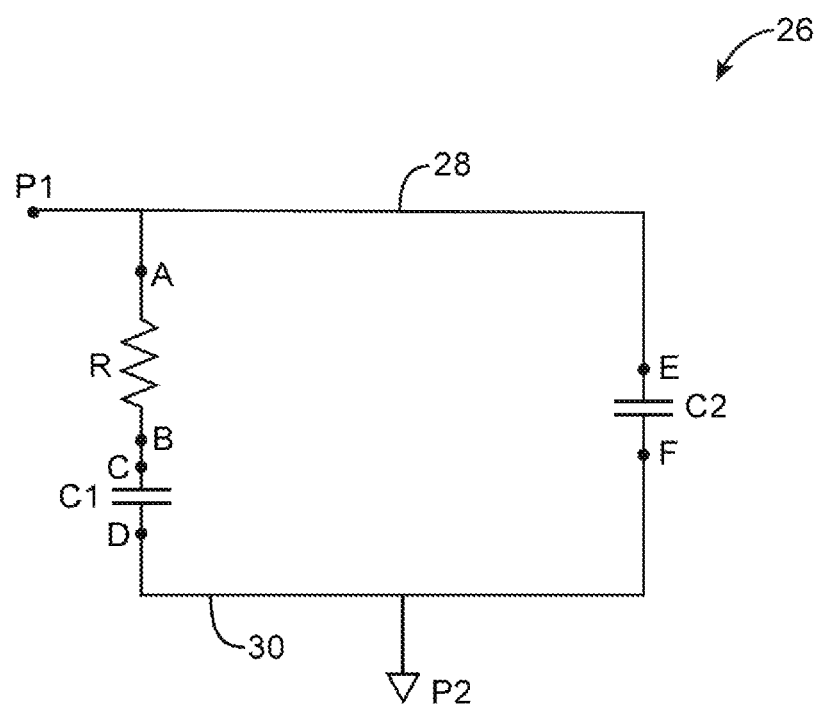
FIG. 19 is a circuit diagram of an illustrative circuit of the type that may be implemented using stacked components in accordance with an embodiment of the present invention.

FIG. 19 is a circuit diagram of another illustrative noise-reducing circuit that may be formed using stacked SMT components. Circuit 26 of FIG. 19 may be used to reduce power supply noise on power supply lines 28 and 30 (as an example). As shown in FIG. 19, circuit 26 may include two capacitors C1 and C2 and a resistor R. Resistor R may have contacts A and B, capacitor C1 may have contacts C and D, and capacitor C2 may have contacts E and F. Resistor R and capacitor C1 may be connected in series between contact P1 on line 28 and contact P2 on line 30. Capacitor C2 may be coupled in parallel with resistor R and capacitor C1.

Figure 20:
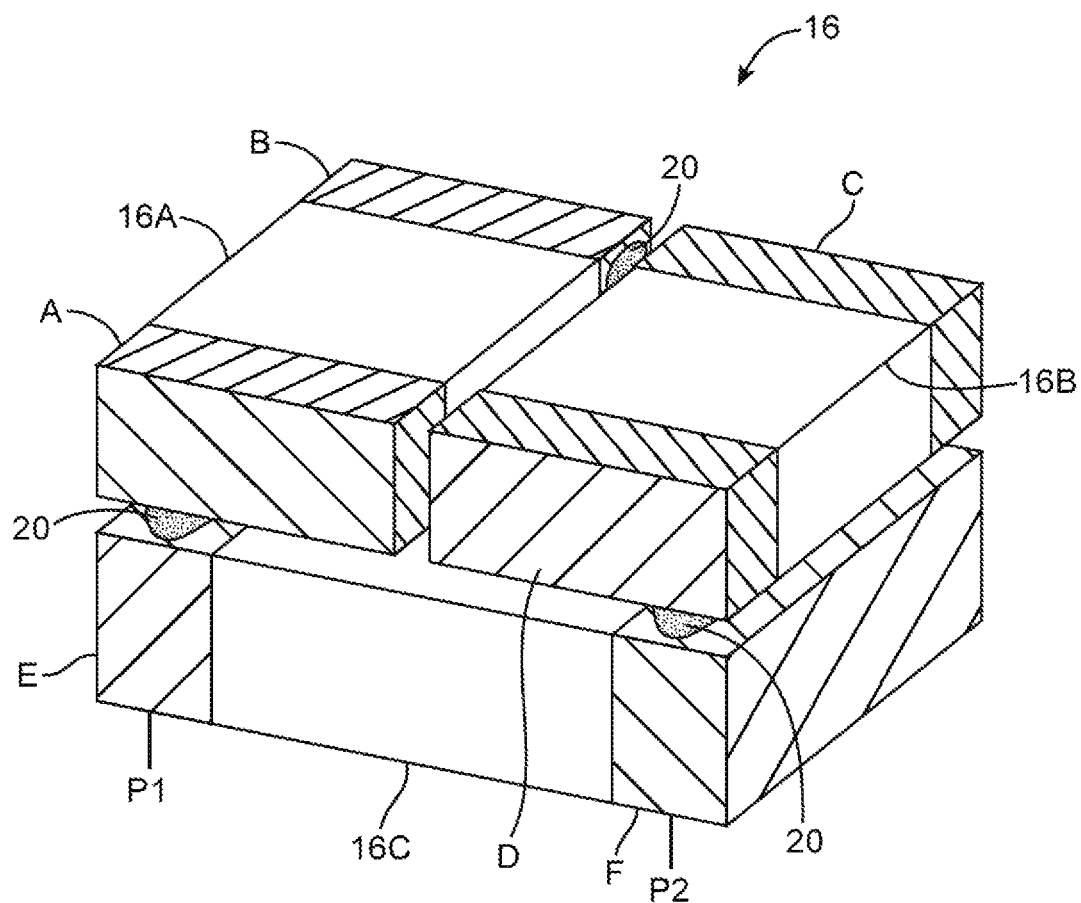
FIG. 20 is a perspective view of illustrative stacked components being used to implement a circuit of the type shown in FIG. 19 in accordance with an embodiment of the present invention.

FIG. 20 is a perspective view of an illustrative component 16 of the type that may be used in implementing circuit 26 of FIG. 19. As shown in FIG. 20, component 16 may be formed from three stacked SMT components 16A, 16B, and 16C. Component 16A may be a resistor such as resistor R of FIG. 19. Component 16B may be a capacitor such as capacitor C1 of FIG. 19. Component 16C may be a capacitor such as capacitor C2 of FIG. 19.

As shown in FIG. 20, contact P1 of component 16 may be formed from contact E of component 16C and contact P2 of component 16 may be formed from contact F of component 16C.

Components 16 such as packed components and individual components that are mounted to a substrate 12 (e.g., a printed circuit substrate) may be subject to manufacturing constraints. Component placement equipment such as SMT component placement tools may include robotic equipment that is used to place the components on substrate 12. The components may, for example, be provided to the component placement equipment in tape and reel arrangements. The component placement equipment may have operating tolerances that constrain how closely the components can be placed on a printed circuit substrate. Components such as components 16 may be further compacted using compression tools to more efficiently use available substrate area.

Figure 21:
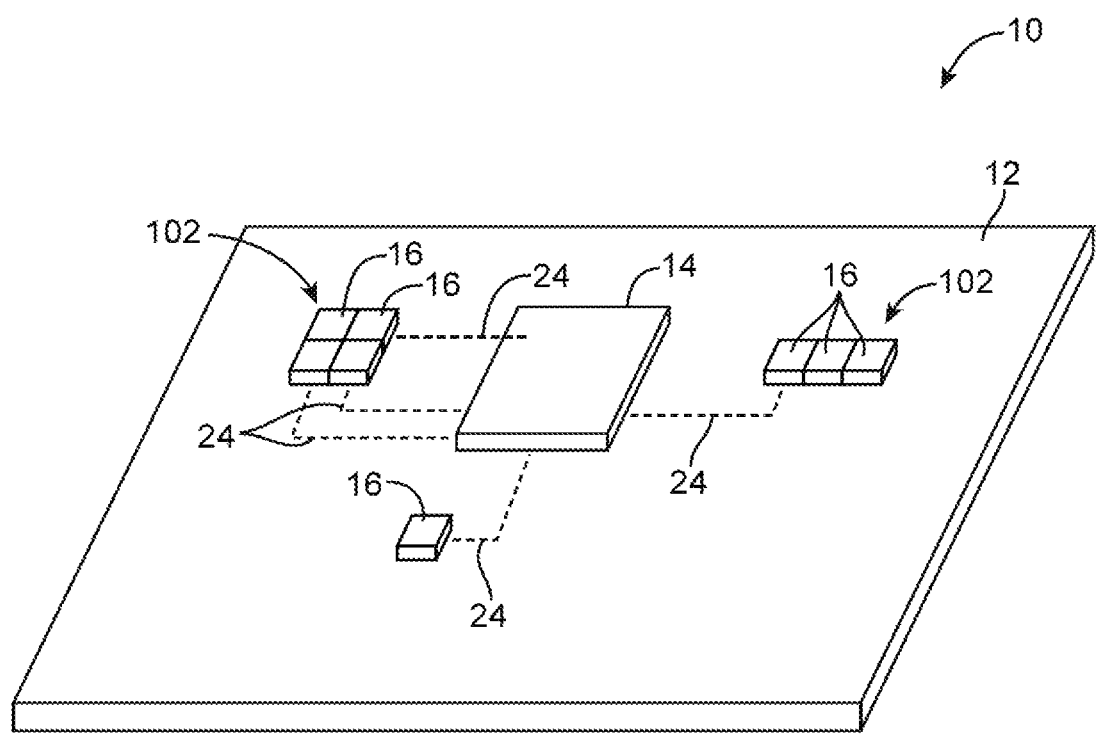
FIG. 21 is a perspective view of a printed circuit board populated with integrated circuits and packed component groups in accordance with an embodiment of the present invention.

FIG. 21 is a perspective view of an illustrative electrical system in which some of components 16 on substrate 12 form packed component groups 102. As shown in FIG. 21, packed component groups 102 may include multiple components 16 (e.g., two, three, four or more components) that are mounted adjacent to each other on substrate 12. Components 16 of each component group 102 may be directly in contact with each other. For example, a first component 16 may include contacts that are connected to contacts of a second component 16. This example is merely illustrative. Contacts of components 16 may be connected to contact pads of printed circuit board 16 (e.g., to form circuits such as noise suppression circuit 26 of FIG. 4). If desired, components 16 of a component group may be separated by an air gap or an insulator to electrically isolate contacts of the components.

Figure 22:
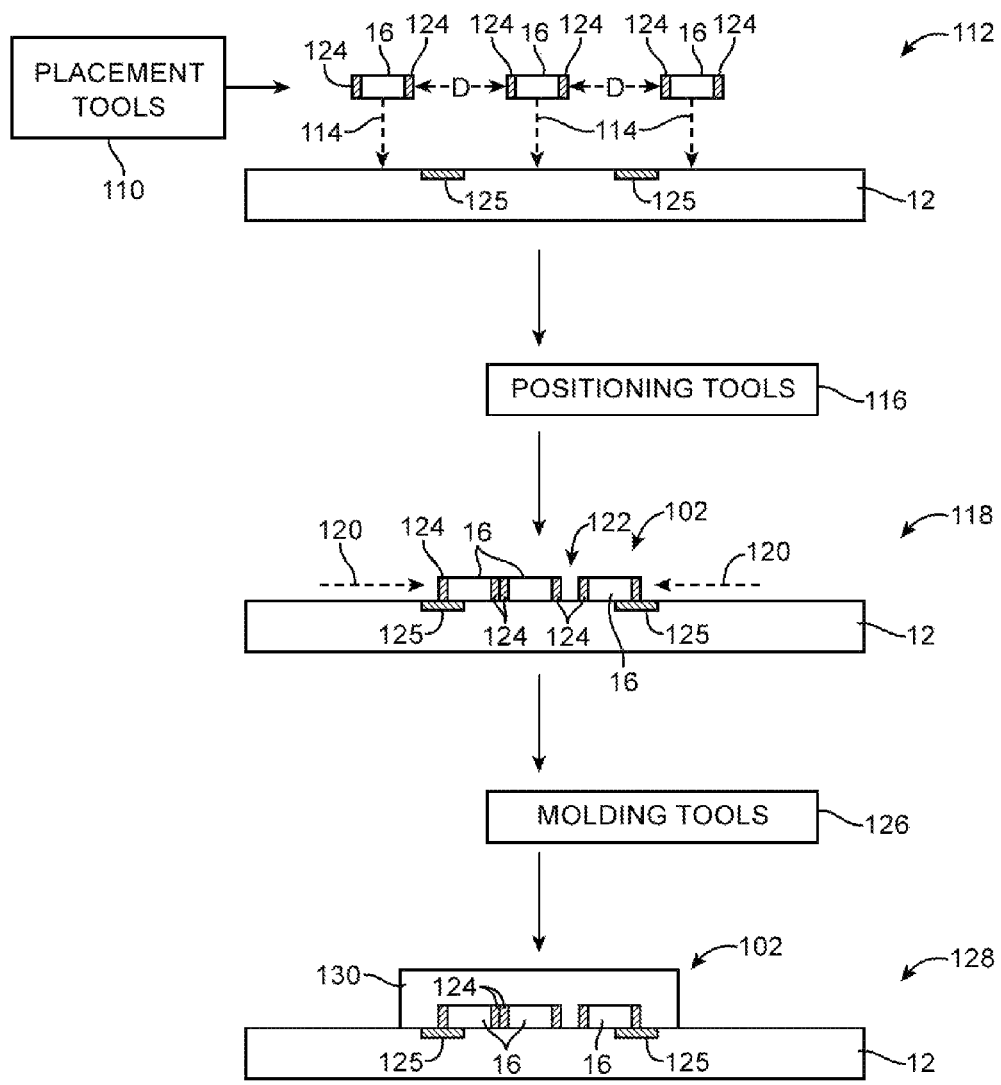
FIG. 22 is a diagram of illustrative steps that may be performed to mount components on a printed circuit board to form packed component groups in accordance with an embodiment of the present invention.

FIG. 22 is a diagram of illustrative steps that may be performed to form a group of adjacent components (e.g., a component group 102 of FIG. 21). During step 112, components 16 may be placed on substrate 12 using component placement tools 110 as shown by arrows 114. Component placement tools 110 may include SMT component placement tools (e.g., pick and place tools). Component placement tools 110 may have operational tolerances that constrain how closely components 16 may be placed on substrate 12. In the example of FIG. 22, manufacturing constraints may require that components 16 are separated by distance D when placed on substrate 12.

During subsequent step 118, the locations of components 16 may be adjusted using component positioning tools 116 to desired locations on printed circuit substrate 12. Component positioning tools may include automated robotic positioning tools or manual positioning tools for adjusting the locations of components 16 on printed circuit substrate 12.

In the example of FIG. 22, component positioning tools 116 may be used to push components 16 together to form desired connections between contacts 124 and contact pads 125. The locations of components 16 may be adjusted so that some components directly contact other components (e.g., contacts 124 of those components may touch). Gaps such as gap 122 may be maintained between other contacts 124. The example of FIG. 22 in which gap 122 is maintained is merely illustrative. Adjacent components 16 of group 102 may be separated by a gap such as gap 122 or may be directly connected to each other (e.g., electrical connections may be formed by direct contact between contacts 124 of components 16).

Molding tools 126 may then be used to deposit a layer of insulating material 130 over components 16 of group 102 as shown in step 128. Insulating materials 130 may include thermoset and thermoplastic materials such as plastics or other polymers. Molding tools 126 may include injection molding tools, insert molding tools, matrix molding tools, compression molding tools, transfer molding tools, and other tools suitable for molding insulating materials 130 into a desired configuration.

Insulating materials 130 may cover components 16 and may help protect components 16. Insulating materials 130 may provide structural support and help to maintain the positioning of components 16 (e.g., to maintain connections between contacts 124 and between contacts 124 and corresponding substrate contact pads 125). Traces such as traces 24 of FIG. 21 may be used to convey signals between components 16 and other circuitry on substrate 12 via contact pads 125. Insulating materials 130 may fill gaps such as gap 122 to help electrically isolate some of components 16.

Figure 23:
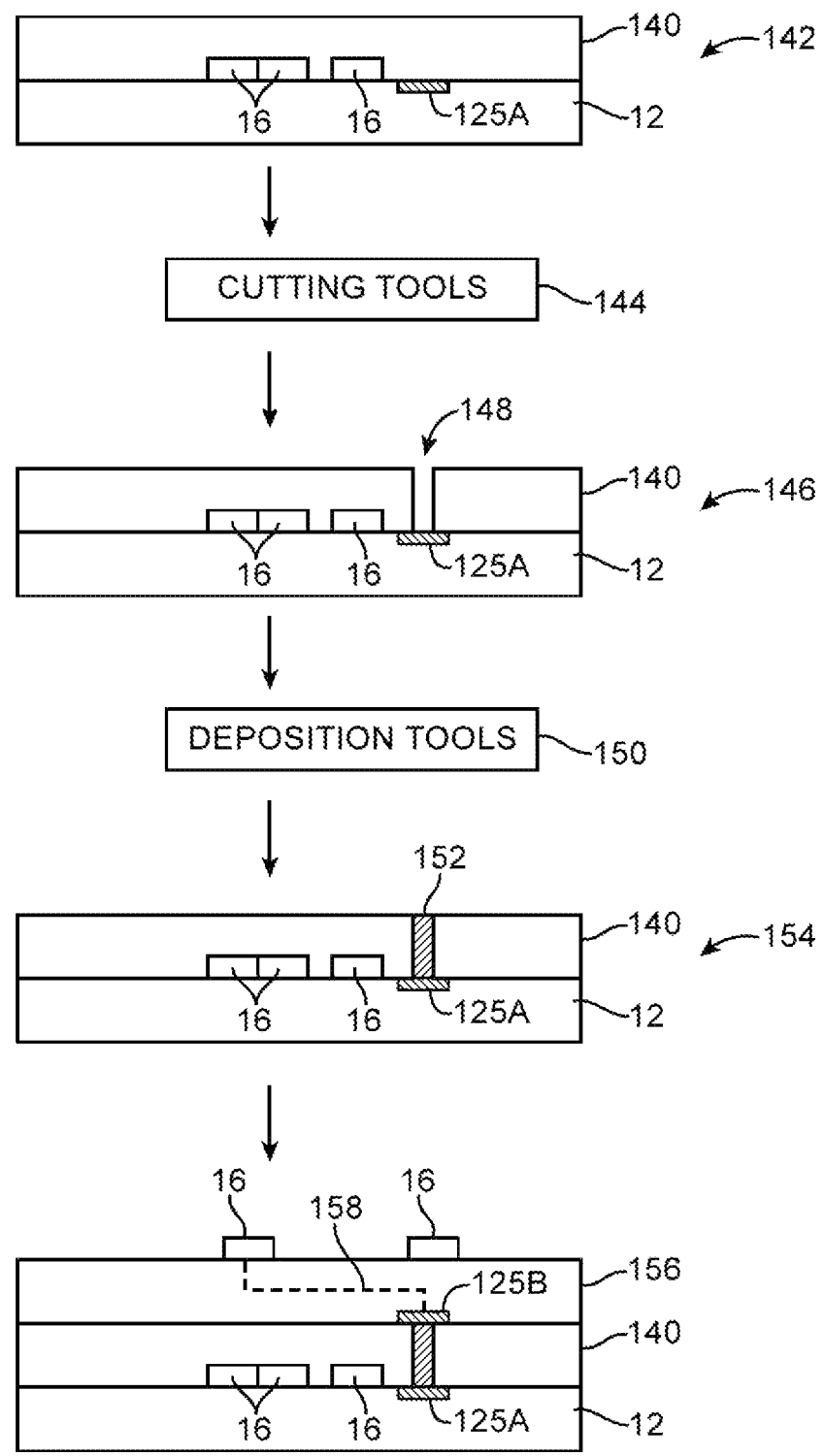
FIG. 23 is a diagram of illustrative steps that may be performed to stack printed circuit substrate layers with components mounted in intervening dielectric layers in accordance with an embodiment of the present invention.

If desired, components 16 may be mounted within intermediate layers between printed circuit substrate layers. FIG. 23 is a diagram of illustrative steps that may be performed to mount components 16 within an intermediate layer 140. At initial step 142, components 16 may be mounted to substrate 12 which may serve as a first substrate layer. Components 16 may be covered with a layer of insulating material 140. Insulating materials 140 may, for example, include dielectric materials such as resin.

Substrate 12 may include contacts such as contact pad 125A. As shown in step 146, cutting tools 144 may be used to form an opening 148 in intermediate layer 140 over contact pad 125A (e.g., so that contact pad 125A is exposed). Opening 148 may have a substantially circular cross section or any other desired cross-sectional shapes. Cutting tools 34 may include drilling tools, sawing tools, laser cutting tools, or other machining or cutting tools suitable for forming opening 148 in insulating layer 140.

Conductive material 152 may be subsequently deposited to fill opening 148 using deposition tools 150 during step 154. Deposition tools 150 may include spraying tools, physical or chemical vapor deposition tools, electroplating tools or any desired deposition tools for depositing conductive materials to fill opening 148. Conductive material 152 may include silver, metals such as copper, or other conductive materials. For example, conductive material 152 may include paste formed from silver, metals, or other conductive materials.

A second printed circuit substrate layer 156 may be formed over intermediate layer 140. Substrate layer 156 may include contacts such as contact pad 125B formed on a rear surface of substrate layer 156 and may have components 16 that are mounted to a front surface. Contact 125B may be coupled to component 16 on the front surface of substrate layer 156 via traces 158 in substrate layer 156. Conductive material 152 may form a conductive via that electrically couples contact pad 125B of substrate layer 156 to contact pad 125B through intermediate layer 140 (e.g., an intermediate layer that includes components such as components 16). Circuitry such as circuitry 26 of FIGS. 4 and 6 may be formed from components 16 on multiple printed circuit substrates (e.g., substrates 12 and 156).

The example of FIG. 23 in which components 16 are mounted on first and second stacked printed circuit layers is merely illustrative. If desired, multiple printed circuit layers may be stacked to help accommodate multiple components within a limited printed circuit substrate area. For example, two, three, or more printed circuit substrate layers such as layers 12 and 156 may be stacked with intervening dielectric layers 140. In this scenario, components may be mounted on each printed circuit substrate layer (e.g., within the intervening dielectric layers) and may form circuits that span multiple printed circuit substrate layers.

Integrated circuits such as integrated circuit 14 of FIG. 21 may include respective integrated circuit dies. The integrated circuit may include surface contacts that are formed at a predetermined pitch (i.e., spacing between the contacts may be predetermined). The pitch may be determined by process and/or design constraints. For example, an integrated circuit design may require a corresponding number of contacts for conveying input-output signals for circuitry on the integrated circuit die. If the number of contacts required by a design increases for a given integrated circuit die area, the pitch of the contacts may be reduced to accommodate the increased number of contacts. As another example, process constraints (e.g., constraints associated with limitations of fabrication tools) may require a minimum pitch for the integrated circuit contacts. In other words, process constraints may limit the maximum number of contacts allowed for a given integrated circuit die area.

In some scenarios, the area required to provide sufficient input-output contacts for an integrated circuit design at a given pitch may be smaller than the area required to implement the circuitry of the integrated circuit. In these scenarios, the integrated circuit may sometimes be referred to as a die-limited integrated circuit, because the integrated circuit area is determined by the die area (e.g., instead of the area required to provide a sufficient number of input-output contacts at the given pitch).

Figure 24:
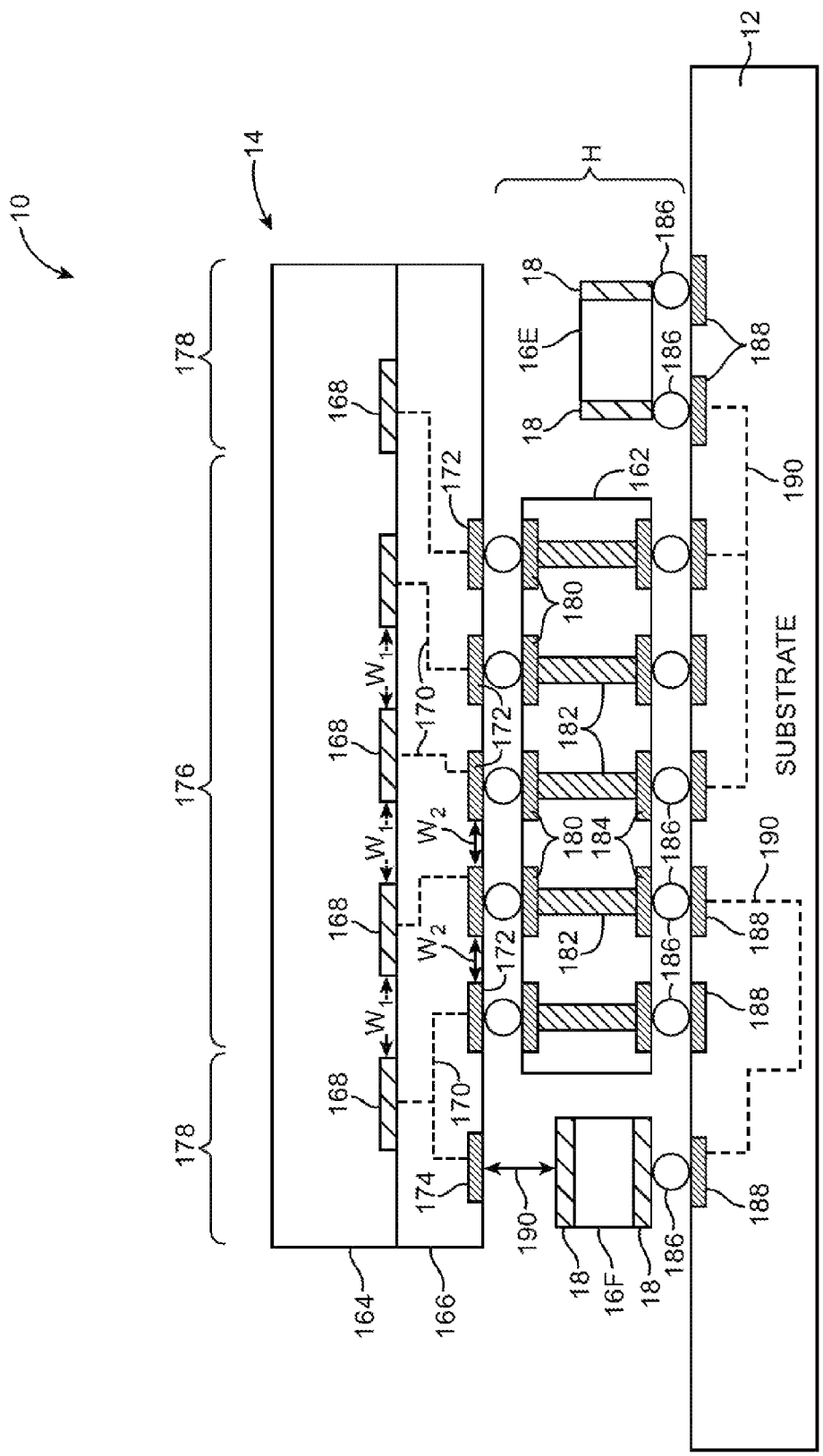
FIG. 24 is a cross-sectional view of an illustrative integrated circuit mounted to a printed circuit board via an interposer and components on the printed circuit board that are covered by the integrated circuit in accordance with an embodiment of the present invention.

To help conserve limited printed circuit substrate area, die-limited integrated circuits may be mounted to a printed circuit substrate via an intervening interposer. FIG. 24 is an illustrative cross-sectional diagram of an integrated circuit 14 that is mounted to substrate 12 via interposer 162 as shown in FIG. 24. Integrated circuit 14 may include an integrated circuit die 164 having contacts 168 formed at a first pitch (i.e., contacts 168 may be separated by distance W1). As an example, contacts 168 may be formed at a 0.4 mm pitch for which distance W1 is 0.4 mm.

Integrated circuit 14 may include a routing layer 166 that covers integrated circuit die 164. Routing layer 166 may include traces 170 that electrically couple contacts 168 to corresponding contacts 172. Routing layer 166 may sometimes be referred to as a redistribution layer (RDL) because input-output signals of contacts 168 of die 164 are redistributed to contacts 172 of redistribution layer 166.

Contacts 172 of redistribution layer 166 may be formed at a second pitch that is smaller than the first pitch (e.g., contacts 172 may be separated by distance W2 that is smaller than distance W1). For example, contacts 172 may be formed at a pitch that is less than 0.4 mm such as 0.3 mm or 0.25 mm. If desired, contacts 172 may be smaller than contacts 168 (e.g., contacts 172 may cover respective areas of integrated circuit 14 that are smaller than area covered by a single contact 168.

By redistributing input-output signals of contacts 168 to contacts 172 having a reduced pitch, additional contacts such as contact 174 may be accommodated on the surface of integrated circuit 14. In the example of FIG. 24, contacts 172 are formed in a central portion 176 of redistribution layer 166, whereas additional contact 174 is formed at a peripheral portion 178. This example is merely illustrative. Contacts 172 and 174 may be formed in any desired location on the rear surface of integrated circuit 14.

Interposer 162 may serve as a raised platform on which integrated circuit 14 is mounted. Interposer 162 may include semiconductors such as silicon (as an example).

Interposer 162 may include contacts 180 that mate with corresponding contacts 172 of integrated circuit 14 via connections 172 (e.g., microbumps, solder balls, etc.). Conductive vias 182 may be formed through interposer 162 that couple contacts 180 to contacts 184. For example, interposer 162 may be formed from a silicon substrate. In this scenario, contacts 180 and 184 may be formed on opposing front and rear surfaces of the silicon substrate, whereas conductive vias 182 may be formed through the silicon substrate (e.g., vias 182 may be through-silicon vias).

Interposer 162 may be mounted to printed circuit substrate 12 via connections 186. Connections 186 may be formed from solder balls between contacts 184 of interposer 162 and corresponding contacts 188 of printed circuit substrate 12. If desired, connections 186 may be formed from pre-formed solder structures that are subsequently reflowed or formed by ink-jetting solder (as examples).

Interposer 162 may be sufficiently tall to allow components 16 to be mounted underneath peripheral regions of integrated circuit 14. Combined height H of interposer 162 and connections 172 and 186 may provide sufficient height for components 16 (e.g., components 16E and 16F) to be mounted to printed circuit substrate 12 under peripheral portions 178 of integrated circuit 14 (e.g., portions of integrated circuit 14 that extend beyond the borders of interposer 162). In other words, height H may be greater than the heights of components 16F and 16E. For example, components 16E and 16F may have heights between 0.3 mm and 0.6 mm and height H may be greater than 0.6 mm.

Components 16 may include contacts 18 and may be mounted to printed circuit substrate 12 via connections 186 (e.g., solder balls or structures between contacts 18 and corresponding contacts 188 of printed circuit substrate 12). Components 16 may, for example, be SMT components that are surface mounted to printed circuit substrate 12.

Contacts 18 of components 16 may be coupled to printed circuit substrate 12 and/or integrated circuit 14. In the example of FIG. 24, component 16E may include two contacts 18 that are coupled to contacts 188 of printed circuit substrate 12 via connections 186. Component 16F may include a first contact that is coupled to printed circuit substrate 12 and a second contact that is coupled to integrated circuit 14 via connection 190. Connection 190 may be formed similar to connection 172 or may be formed from a wire bond between the second contact 18 of component 16F and contact 174 of integrated circuit 14. Contact 174 of integrated circuit 14 may be formed on redistribution layer 166 and may be coupled to contacts 168 and/or 172 via traces 170 of layer 166.

The example of FIG. 24 in which component 16E is coupled to printed circuit substrate 12 and component 16F is coupled to integrated circuit 14 and printed circuit substrate 12 is merely illustrative. If desired, components 16 may be mounted under peripheral portions 178 of integrated circuit 14 using any desired arrangement to more efficiently utilize available area on printed circuit substrate 12. For example, components 16 may include contacts 18 that are coupled to printed circuit substrate 12, redistribution layer 166 of integrated circuit, or any desired combination of substrate 122 and layer 166.

Figure 25:
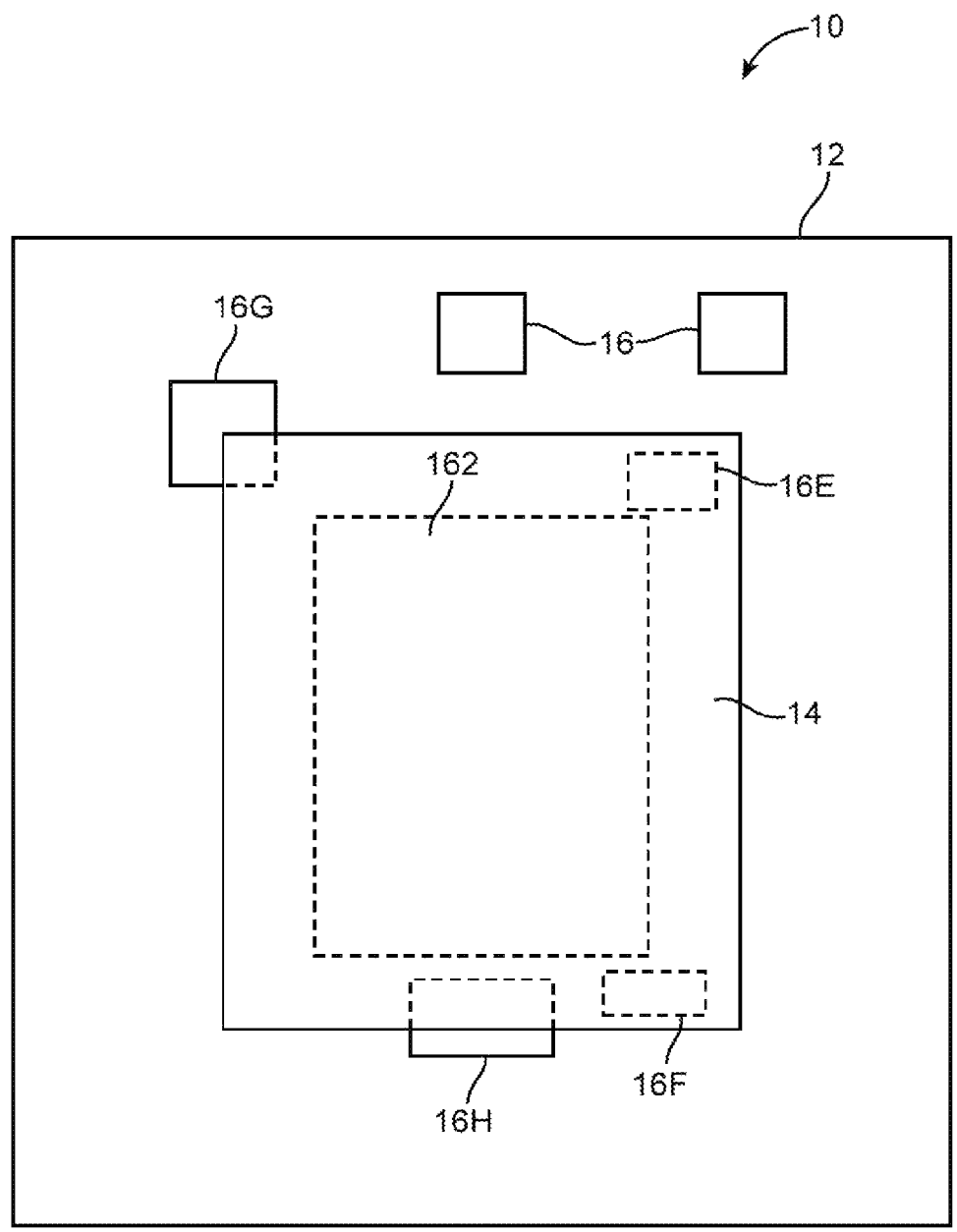
FIG. 25 is a top-down view of an illustrative integrated circuit mounted to a printed circuit board via an interposer to cover components on the printed circuit board in accordance with an embodiment of the present invention.

FIG. 25 is an illustrative top-down view of circuitry 10 that may include integrated circuit 14 mounted to substrate 12 via interposer 162 and components 16 that are covered by integrated circuit 14. As shown in FIG. 25, some components such as components 16E and 16F may be entirely covered by integrated circuit 14 whereas other components such as components 16G and 16H may be partially covered by integrated circuit 14. Other components 16 may be exposed (i.e., not covered by integrated circuit 14).

Figure 26:
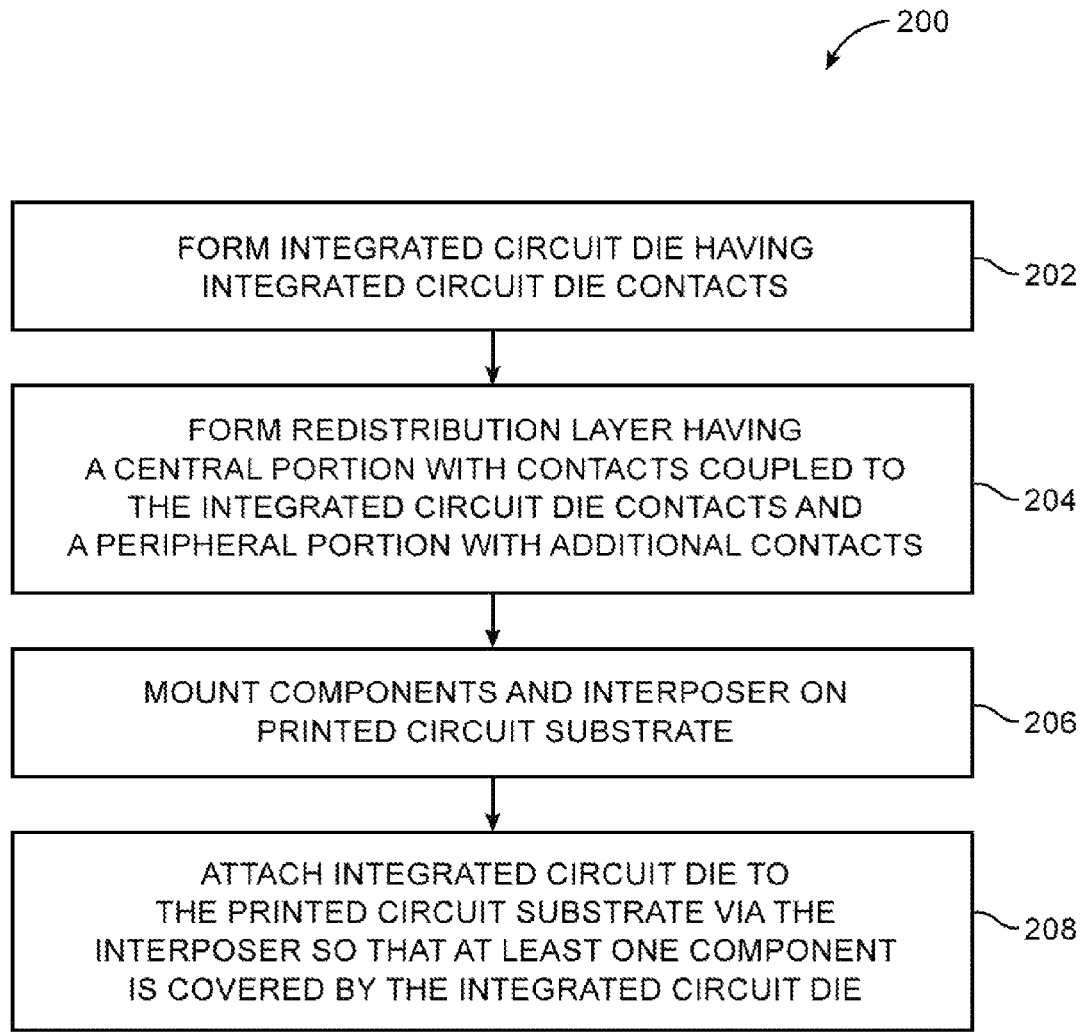
FIG. 26 is a flow chart of illustrative steps that may be performed to mount an integrated circuit to a printed circuit board via an interposer to cover components in accordance with an embodiment of the present invention.

FIG. 26 is a flow chart 200 of illustrative steps that may be performed to mount an integrated circuit to a printed circuit substrate so that at least one component on the printed circuit substrate is covered by the integrated circuit.

During the operations of step 202, an integrated circuit die may be formed (e.g., fabricated) having integrated circuit die contacts. The die contacts may be formed at a predetermined pitch. For example, integrated circuit die 164 of FIG. 24 may be formed having contacts 168 that are separated by distances W1.

During step 204, a redistribution layer may be formed having a central portion and a peripheral portion. The central portion may include contacts that are coupled to the integrated circuit die contacts through the redistribution layer. For example, redistribution layer 166 of FIG. 24 may be formed having contacts 172 that are coupled to contacts 168 of integrated circuit die 164 via traces 170. The redistribution layer may include additional contacts such as contact 174 formed on the peripheral portion of the redistribution layer. The contacts of the redistribution layer may be formed at a smaller pitch than the integrated circuit die contacts to accommodate the additional contacts on the peripheral portion.

During step 206, components and an interposer may be mounted to a printed circuit substrate. For example, components 16 such as surface-mount components and interposer 162 may be mounted to contacts 188 of printed circuit substrate via connections 186. Some of the components may be mounted adjacent to the interposer (e.g., in areas that would have been occupied by the integrated circuit die if mounted to the printed circuit substrate without the interposer).

During step 208, the integrated circuit die may be attached to the printed circuit substrate via the interposer so that components that are adjacent to the interposer are covered by the integrated circuit die. For example, integrated circuit die 14 of FIG. 25 may be mounted to the interposer 12 so that components 16E and 16F are covered and components 16G and 16H are partially covered.

Figure 27:
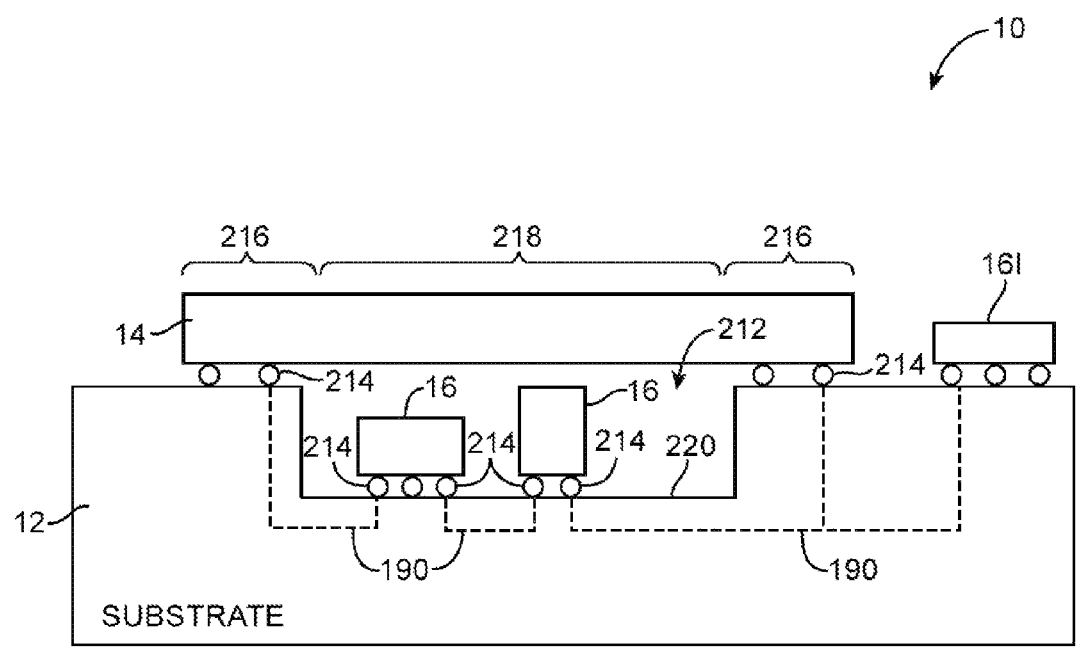
FIG. 27 is an illustrative cross-sectional view of an integrated circuit mounted to a printed circuit board over a recessed portion of the integrated circuit and components that are mounted on the recessed portion in accordance with an embodiment of the present invention.

Area may be conserved on a printed circuit substrate by providing recesses in the printed circuit substrate under integrated circuits and mounting components within the recesses. FIG. 27 is an illustrative cross-sectional view of a printed circuit substrate 12 with a recess 212. Integrated circuit 14 may be mounted over recess 212 via connections 214 (e.g., solder balls or structures formed between contacts of integrated circuit 14 and corresponding contacts of printed circuit substrate 12).

Integrated circuit 14 may be coupled to printed circuit substrate 12 at peripheral regions (portions) 216 of integrated circuit 14. Integrated circuit 14 may, for example, be a die-limited integrated circuit such as a memory integrated circuit (e.g., a NAND memory integrated circuit or other memory integrated circuits in which integrated circuit area is determined by the size of circuitry on the integrated circuit). In this scenario, input-output signals of integrated circuit 14 may be routed to peripheral regions 216 and connections 214 using a redistribution layer similar to redistribution layer 166 of FIG. 24.

Central region 218 of integrated circuit may cover recess 212 and components 16 that are mounted to recessed portion 220 of printed circuit substrate 12. Components 16 may be mounted to recessed portion 220 via connections 214. Additional components 16 may be mounted to printed circuit substrate 12 outside of recessed portion 220. For example, component 16I may be mounted to a top surface of substrate 12 and is not covered by integrated circuit 14. Components 16 and integrated circuit 14 may be electrically coupled via traces 190 of printed circuit substrate 12.

Figure 28:
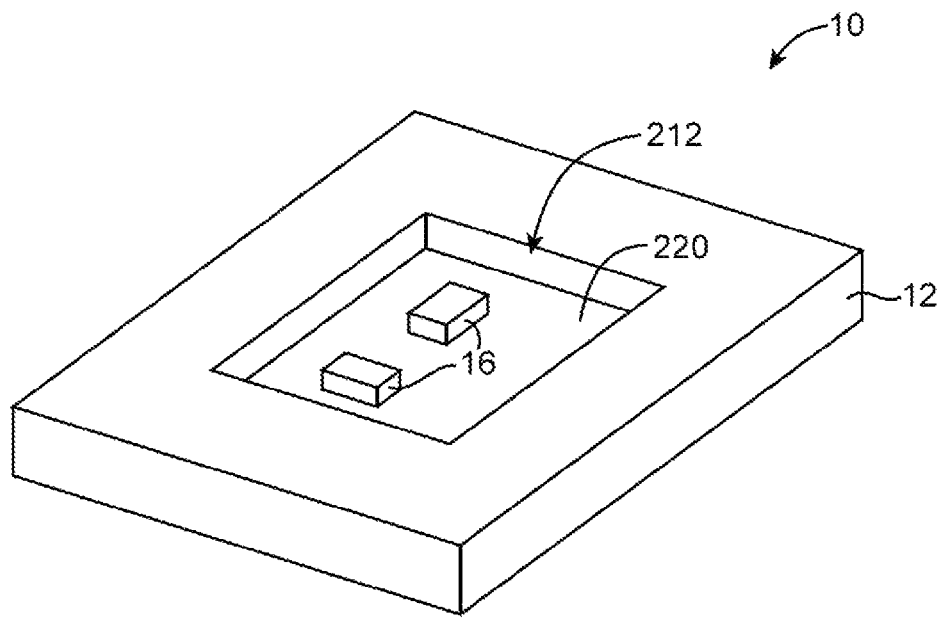
FIG. 28 is an illustrative perspective view of components mounted on a recessed portion of a printed circuit board in accordance with an embodiment of the present invention.
Figure 29:
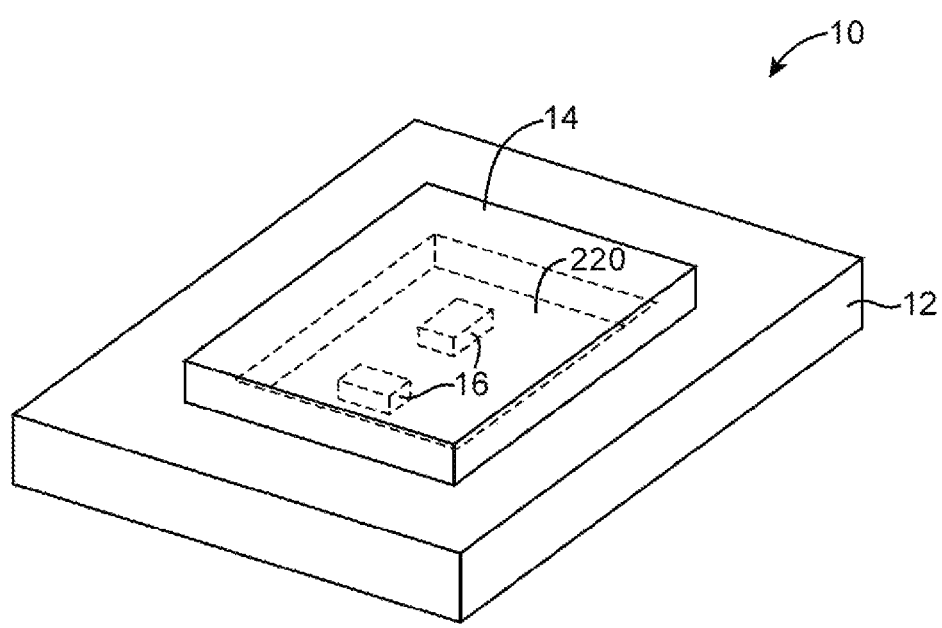
FIG. 29 is an illustrative perspective view of an integrated circuit mounted to a printed circuit board over a recessed portion of the integrated circuit and components that are mounted on the recessed portion in accordance with an embodiment of the present invention.

FIG. 28 is an illustrative perspective view of circuitry 10 showing how a printed circuit substrate 12 may include a recess 212 (e.g., recess 212 of FIG. 27). As shown in FIG. 28, components 16 may be mounted on recessed portion 220 of substrate 12. As shown in FIG. 29, integrated circuit 14 may cover recessed portion 220 of substrate 12 and components 16 that are mounted on recessed portion 220.

The foregoing is merely illustrative of the principles of this invention and various modifications can be made by those skilled in the art without departing from the scope and spirit of the invention.

What is claimed is:

1. Apparatus, comprising:
   a printed circuit board having printed circuit board contacts on a surface; and
   an electrical component formed from a plurality of stacked surface mount technology components on the surface of the printed circuit board, wherein:
      the plurality of stacked surface mount technology components includes at least a first surface mount technology component having first component contacts, a second surface mount technology component having second component contacts, a third surface mount technology component having third component contacts, and a fourth surface mount technology component having fourth component contacts;
      the electrical component has first, second, and third terminals coupled directly to the printed circuit board contacts;
      the first and second surface mount technology components are both mounted directly to the printed circuit board and the third and fourth surface mount technology components are mounted on the first and second surface mount technology components;
      the third surface mount technology component has a first portion that overlaps the first surface mount technology component without overlapping the second surface mount technology component and a second portion that is different than the first portion that overlaps the second surface mount technology component without overlapping the first surface mount technology component; and
      the fourth surface mount technology component has a first portion that overlaps the first surface mount technology component without overlapping the second surface mount technology component and a second portion that is different than the first portion that overlaps the second surface mount technology component without overlapping the first surface mount technology component.

2. The apparatus defined in claim 1 further comprising an integrated circuit on the printed circuit board, wherein the integrated circuit comprises a power supply input and the electrical component is configured to reduce noise on the power supply input.

3. The apparatus defined in claim 2 wherein the first surface mount technology component comprises a capacitor and the second surface mount technology component comprises a capacitor.

4. The apparatus defined in claim 3 wherein the third surface mount technology component comprises a capacitor.

5. Apparatus, comprising:
   a printed circuit board having first, second, and third printed circuit board contacts; and
   an electrical component formed from a plurality of stacked surface mount technology components on the printed circuit board, wherein:
      the plurality of stacked surface mount technology components includes a first surface mount technology component having first and second component contacts, a second surface mount technology component having third and fourth component contacts, a third surface mount technology component having fifth and sixth component contacts, and a fourth surface mount technology component having seventh and eight component contacts;
      the first and second surface mount technology components are mounted adjacent to each other on the printed circuit board such that the first component contact is soldered to the first printed circuit board contact, the second component contact is soldered to the second printed circuit board contact, and the third component contact is soldered to the third printed circuit board contact;
      the third surface mount technology component is mounted on the first and second surface mount technology components;
      the fourth surface mount technology component is mounted on the first and second surface mount technology components and adjacent to the third surface mount technology component;
      the sixth component contact is soldered to the third component contact;
      the third surface mount technology component has a first portion that overlaps the first surface mount technology component without overlapping the second surface mount technology component and a second portion that is different than the first portion that overlaps the second surface mount technology component without overlapping the first surface mount technology component; and
      the fourth surface mount technology component has a first portion that overlaps the first surface mount technology component without overlapping the second surface mount technology component and a second portion that is different than the first portion that overlaps the second surface mount technology component without overlapping the first surface mount technology component.

6. The apparatus defined in claim 5 further comprising an integrated circuit on the printed circuit board, wherein the integrated circuit comprises a power supply input and the electrical component is configured to reduce noise on the power supply input.

7. The apparatus defined in claim 6 wherein the first surface mount technology component comprises a resistor, the second surface mount technology component comprises a capacitor, and the third surface mount technology component comprises a capacitor.

8. The apparatus defined in claim 4, wherein the fourth surface mount technology component comprises an inductor.

9. The apparatus defined in claim 5, wherein the sixth component contact is soldered to the third component contact with solder, the solder is interposed between the third component contact and the sixth component contact, and the solder, the third component contact, and the sixth component contact are vertically overlapping.

10. The apparatus defined in claim 9, wherein the seventh component contact is soldered to the sixth component contact with additional solder.

11. The apparatus defined in claim 10, wherein the additional solder is interposed between the sixth component contact and the seventh component contact and the additional solder, sixth component contact, and seventh component contact are not vertically overlapping.

12. The apparatus defined in claim 1, wherein the first surface mount technology component is interposed between the printed circuit board and the third and fourth surface mount technology components.

13. The apparatus defined in claim 12, wherein the second surface mount technology component is interposed between the printed circuit board and the third and fourth surface mount technology components.

14. The apparatus defined in claim 13, wherein the first and second surface mount technology components are laterally adjacent to each other on the printed circuit board.

* * * * *